(12) United States Patent
Furukawa et al.

(10) Patent No.: US 11,005,405 B2
(45) Date of Patent: May 11, 2021

(54) ROTATING-ELECTRIC-MACHINE CONTROL APPARATUS AND ELECTRIC POWER STEERING CONTROL APPARATUS EQUIPPED WITH THE ROTATING-ELECTRIC-MACHINE CONTROL APPARATUS

(71) Applicant: Mitsubishi Electric Corporation, Tokyo (JP)

(72) Inventors: Akira Furukawa, Tokyo (JP); Munenori Yamamoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 194 days.

(21) Appl. No.: 16/327,914

(22) PCT Filed: Nov. 16, 2016

(86) PCT No.: PCT/JP2016/083948
§ 371 (c)(1),
(2) Date: Feb. 25, 2019

(87) PCT Pub. No.: WO2018/092210
PCT Pub. Date: May 24, 2018

(65) Prior Publication Data
US 2019/0267925 A1    Aug. 29, 2019

(51) Int. Cl.
*H02P 25/22* (2006.01)
*B62D 5/04* (2006.01)
(Continued)

(52) U.S. Cl.
CPC ............ *H02P 25/22* (2013.01); *B62D 5/0463* (2013.01); *B62D 5/0481* (2013.01);
(Continued)

(58) Field of Classification Search
USPC ........................................................ 318/560
See application file for complete search history.

(56) References Cited

U.S. PATENT DOCUMENTS

2010/0213884 A1\* 8/2010 Xiang ....................... H02P 6/34
318/400.36
2011/0025369 A1    2/2011 Quarto
(Continued)

FOREIGN PATENT DOCUMENTS

JP    2011-078230 A    4/2011
JP    5496257 B2    5/2014

OTHER PUBLICATIONS

Extended European Search Report dated Aug. 8, 2019 issued by the European Patent Office in counterpart application No. 16921711.4.
(Continued)

*Primary Examiner* — Bentsu Ro
(74) *Attorney, Agent, or Firm* — Sughrue Mion, PLLC; Richard C. Turner

(57) ABSTRACT

When a switching device cutoff failure determination unit determines a failure in a switching device cutoff switching unit, output torque produced based on the first armature winding and output torque produced based on the second armature winding are produced in such a way that the respective directions thereof are opposite to each other.

20 Claims, 8 Drawing Sheets

(51) Int. Cl.
  *H02P 27/08*   (2006.01)
  *H02P 29/024*  (2016.01)
  *G01R 31/42*   (2006.01)

(52) U.S. Cl.
  CPC ......... *B62D 5/0484* (2013.01); *B62D 5/0487* (2013.01); *H02P 27/08* (2013.01); *H02P 29/024* (2013.01); *H02P 29/0241* (2016.02); *G01R 31/42* (2013.01)

(56) References Cited

U.S. PATENT DOCUMENTS

| | | |
|---|---|---|
| 2011/0074333 A1 | 3/2011 | Suzuki |
| 2016/0164447 A1 | 6/2016 | Wu et al. |
| 2019/0267925 A1* | 8/2019 | Furukawa ............. H02P 29/024 |
| 2020/0067443 A1* | 2/2020 | Watanabe ........... H02P 29/0241 |
| 2020/0224762 A1* | 7/2020 | Yamamoto ............. F16H 61/12 |

OTHER PUBLICATIONS

International Search Report for PCT/JP2016/083948, dated Jan. 31, 2017.

Notice of Reasons for Refusal dated Dec. 24, 2019 issued by the Japanese Patent Office in counterpart Application No. 2018-550915.

* cited by examiner

ROTATING-ELECTRIC-MACHINE CONTROL APPARATUS AND ELECTRIC POWER STEERING CONTROL APPARATUS EQUIPPED WITH THE ROTATING-ELECTRIC-MACHINE CONTROL APPARATUS

CROSS REFERENCE TO RELATED APPLICATIONS

This Application is a National Stage of International Application No. PCT/JP2016/083948 filed Nov. 16, 2016.

TECHNICAL FIELD

The present invention relates to a rotating-electric-machine control apparatus having two or more groups of armature windings and an electric power steering apparatus equipped with the rotating-electric-machine control apparatus.

BACKGROUND ART

To date, there has been an electric power steering apparatus configured in such a way that an abnormality in the driving stopping function of a switching device for driving a rotating electric machine that generates assist torque is monitored and a latent failure is detected so that the safety is improved by preventing abnormal operation of the rotating electric machine (for example, refer to Patent Document 1).

The conventional electric power steering apparatus disclosed in Patent Document 1 is configured in such a way that at a time of starting, a switching device for driving a rotating electric machine is driven and then it is ascertained by use of a terminal voltage of the rotating electric machine that the driving of the switching device is stopped by a cutoff signal outputted for checking from a microcomputer.

PRIOR ART REFERENCE

Patent Document

[Patent Document 1] Japanese Patent Publication No. 5496257

DISCLOSURE OF THE INVENTION

Problems to be Solved by the Invention

In the conventional electric-power-steering control apparatus disclosed in Patent Document 1, in order to prevent that output torque is generated by the rotating electric machine and hence the handwheel autonomously rotates, while it is ascertained whether or not there exists an abnormality in the switching-device driving stopping function at a time of starting, it is ascertained whether or not there exists an abnormality in any one of the switching devices of a bridge circuit included in an electric-power conversion apparatus. However, because in order to prevent the output torque of the rotating electric machine from being generated, it is ascertained whether or not there exists an abnormality in any one of the switching devices, it is required to provide a terminal voltage detection unit that detects a terminal voltage of the rotating electric machine so as to determine whether or not the switching device has been cut off.

The present invention has been implemented in order to solve the foregoing problem in the conventional electric power steering apparatus; the objective thereof is to provide a rotating-electric-machine control apparatus in which the configuration required for ascertaining the switching-device cutoff function is simplified and an electric power steering apparatus equipped with the rotating-electric-machine control apparatus.

Means for Solving the Problems

The rotating-electric-machine control apparatus according to the present invention controls a rotating electric machine having at least a first armature winding and a second armature winding and includes
a voltage applying device that converts a DC voltage from a DC power source into an AC voltage and applies the AC voltage to the first armature winding and the second armature winding;
a voltage command calculator that is configured in such a way as to calculate a voltage command, based on a current command for the rotating electric machine;
a switching signal generator that is configured in such a way as to output a switching signal for driving a switching device included in the voltage applying device, based on the voltage command calculated by the voltage command calculator;
a switching device cutoff switcher that is configured in such a way as to switch the state of the switching device from a driving state to a cutoff state; and
a switching device cutoff failure determiner that is configured in such a way as to determine a failure in the switching device cutoff switcher,
wherein when the switching device cutoff failure determiner determines a failure in the switching device cutoff switcher, the current command or the voltage command is set in such a way that when the switching device is in the driving state, the respective directions of output torque produced based on the first armature winding and output torque produced based on the second armature winding are opposite to each other or in such a way that when the switching device is in the cutoff state, the respective directions of output torque produced based on the first armature winding and output torque produced based on the second armature winding are opposite to each other.

Moreover, the rotating-electric-machine control apparatus according to the present invention controls a rotating electric machine having at least a first armature winding and a second armature winding and includes
a voltage applying device that converts a DC voltage from a DC power source into an AC voltage and applies the AC voltage to the first armature winding and the second armature winding;
a voltage command calculator that is configured in such a way as to calculate a voltage command, based on a current command for the rotating electric machine;
a switching signal generator that is configured in such a way as to output a switching signal for driving a switching device included in the voltage applying device, based on the voltage command calculated by the voltage command calculator;
a switching device cutoff switcher that is configured in such a way as to switch the state of the switching device from a driving state to a cutoff state; and
a switching device cutoff failure determiner that is configured in such a way as to determine a failure in the switching device cutoff switcher, wherein when the switching device cutoff failure determiner determines a failure in the switching device cutoff switcher, the current command or the voltage command is set in such a way that letting T1 denote output torque based on the first armature winding at a time when the switching device is in the driving state, letting T1off denote output torque based on the first armature winding at a time when the switching device is in the cutoff state, and letting T2 denote output torque produced based on the second armature winding, the T2 is larger than −T1 but smaller than −T1off or larger than −T1off but smaller than −T1.

Furthermore, the electric power steering apparatus according to the present invention includes a rotating-electric-machine control apparatus for controlling a rotating electric machine having at least a first armature winding and a second armature winding, and a rotating electric machine that is controlled by the rotating-electric-machine control apparatus and generates assist torque for assisting steering by a vehicle driver; the electric power steering apparatus is characterized in that the rotating-electric-machine control apparatus includes a voltage applying device that converts a DC voltage from a DC power source into an AC voltage and applies the AC voltage to the first armature winding and the second armature winding;

a voltage command calculator that is configured in such a way as to calculate a voltage command, based on a current command for the rotating electric machine;

a switching signal generator that is configured in such a way as to output a switching signal for driving a switching device included in the voltage applying device, based on the voltage command calculated by the voltage command calculator;

a switching device cutoff switcher that is configured in such a way as to switch the state of the switching device from a driving state to a cutoff state; and a switching device cutoff failure determiner that is configured in such a way as to determine a failure in the switching device cutoff switcher, wherein when the switching device cutoff failure determiner determines a failure in the switching device cutoff switcher, the current command or the voltage command is set in such a way that when the switching device is in the driving state, the respective directions of output torque produced based on the first armature winding and output torque produced based on the second armature winding are opposite to each other or in such a way that when the switching device is in the cutoff state, the respective directions of output torque produced based on the first armature winding and output torque produced based on the second armature winding are opposite to each other.

Furthermore, the electric power steering apparatus according to the present invention includes a rotating-electric-machine control apparatus for controlling a rotating electric machine having at least a first armature winding and a second armature winding, and a rotating electric machine that is controlled by the rotating-electric-machine control apparatus and generates assist torque for assisting steering by a vehicle driver; the electric power steering apparatus is characterized in that the rotating-electric-machine control apparatus controls a rotating electric machine having at least a first armature winding and a second armature winding and includes a voltage applying device that converts a DC voltage from a DC power source into an AC voltage and applies the AC voltage to the first armature winding and the second armature winding;

a voltage command calculator that is configured in such a way as to calculate a voltage command, based on a current command for the rotating electric machine;

a switching signal generator that is configured in such a way as to output a switching signal for driving a switching device included in the voltage applying device, based on the voltage command calculated by the voltage command calculator;

a switching device cutoff switcher that is configured in such a way as to switch the state of the switching device from a driving state to a cutoff state; and a switching device cutoff failure determiner that is configured in such a way as to determine a failure in the switching device cutoff switcher, wherein when the switching device cutoff failure determiner determines a failure in the switching device cutoff switcher, the current command or the voltage command is set in such a way that letting T1 denote output torque based on the first armature winding at a time when the switching device is in the driving state, letting T1off denote output torque based on the first armature winding at a time when the switching device is in the cutoff state, and letting T2 denote output torque produced based on the second armature winding, the T2 is larger than −T1 but smaller than −T1off or larger than −T1off but smaller than −T1.

Advantage of the Invention

The rotating-electric-machine control apparatus according to the present invention controls a rotating electric machine having at least a first armature winding and a second armature winding and includes a voltage applying device that converts a DC voltage from a DC power source into an AC voltage and applies the AC voltage to the first armature winding and the second armature winding, a voltage command calculator that is configured in such a way as to calculate a voltage command, based on a current command for the rotating electric machine, a switching signal generator that is configured in such a way as to output a switching signal for driving a switching device included in the voltage applying device, based on the voltage command calculated by the voltage command calculator, a switching device cutoff switcher that is configured in such a way as to switch the state of the switching device from a driving state to a cutoff state, and a switching device cutoff failure determiner that is configured in such a way as to determine a failure in the switching device cutoff switcher. When the switching device cutoff failure determiner determines a failure in the switching device cutoff switcher, the current command or the voltage command is set in such a way that when the switching device is in the driving state, the respective directions of output torque produced based on the first armature winding and output torque produced based on the second armature winding are opposite to each other or in such a way that when the switching device is in the cutoff state, the respective directions of output torque produced based on the first armature winding and output torque produced based on the second armature winding are opposite to each other; therefore, there is demonstrated an effect that the output torque can be suppressed before a failure in the switching device cutoff switcher is determined and that there can be obtained a rotating-electric-machine control apparatus in which the configuration required for ascertaining the switching-device cutoff function is simplified.

Moreover, the rotating-electric-machine control apparatus according to the present invention controls a rotating electric machine having at least a first armature winding and a second armature winding and includes a voltage device that converts a DC voltage from a DC power source into an AC voltage and applies the AC voltage to the first armature winding and the second armature winding, a voltage command calculator that is configured in such a way as to calculate a voltage command, based on a current command for the rotating electric machine, a switching signal generator that is configured in such a way as to output a switching signal for driving a switching device included in the voltage applying device, based on the voltage command calculated by the voltage command calculator, a switching device cutoff switcher that is configured in such a way as to switch the state of the switching device from a driving state to a cutoff state, and a switching device cutoff failure determiner that is configured in such a way as to determine a failure in the switching device cutoff switcher. When the switching device cutoff failure determiner determines a failure in the switching device cutoff switcher, the current command or the voltage command is set in such a way that letting T1 denote output torque based on the first armature winding at a time when the switching device is in the driving state, letting T1off denote output torque based on the first armature winding at a time when the switching device is in the cutoff state, and letting T2 denote output torque produced based on the second armature winding, the T2 is larger than −T1 but smaller than −T1off or larger than −T1off but smaller than −T1; therefore, both the sum of the output torques produced in the driving state and the sum of the output torques produced in the cutoff state decrease and hence the output torque can be suppressed to fall within the mechanical loss even when a larger current is made to flow; thus, the failure determination can be performed in the state where behavior is not likely to occur.

Furthermore, an electric power steering apparatus equipped with the rotating-electric-machine control apparatus according to the present invention includes a rotating-electric-machine control apparatus for controlling a rotating electric machine having at least a first armature winding and a second armature winding, and a rotating electric machine that is controlled by the rotating-electric-machine control apparatus and generates assist torque for assisting steering by a vehicle driver. The rotating-electric-machine control apparatus includes a voltage applying device that converts a DC voltage from a DC power source into an AC voltage and applies the AC voltage to the first armature winding and the second armature winding, a voltage command calculator that is configured in such a way as to calculate a voltage command, based on a current command for the rotating electric machine, a switching signal generator that is configured in such a way as to output a switching signal for driving a switching device included in the voltage applying device, based on the voltage command calculated by the voltage command calculator, a switching device cutoff switcher that is configured in such a way as to switch the state of the switching device from a driving state to a cutoff state, and a switching device cutoff failure determiner that is configured in such a way as to determine a failure in the switching device cutoff switcher. When the switching device cutoff failure determiner determines a failure in the switching device cutoff switcher, the current command or the voltage command is set in such a way that when the switching device is in the driving state, the respective directions of output torque produced based on the first armature winding and output torque produced based on the second armature winding are opposite to each other or in such a way that when the switching device is in the cutoff state, the respective directions of output torque produced based on the first armature winding and output torque produced based on the second armature winding are opposite to each other; therefore, there is demonstrated an effect that the output torque can be suppressed before a failure in the switching device cutoff switcher is determined and that the configuration required for ascertaining the switching-device cutoff function can be simplified.

Still moreover, in an electric power steering apparatus equipped with the rotating-electric-machine control apparatus according to the present invention, the rotating-electric-machine control apparatus controls a rotating electric machine having at least a first armature winding and a second armature winding and includes a voltage applying device that converts a DC voltage from a DC power source into an AC voltage and applies the AC voltage to the first armature winding and the second armature winding, a voltage command calculator that is configured in such a way as to calculate a voltage command, based on a current command for the rotating electric machine, a switching signal generator that is configured in such a way as to output a switching signal for driving a switching device included in the voltage applying device, based on the voltage command calculated by the voltage command calculator, a switching device cutoff switcher that is configured in such a way as to switch the state of the switching device from a driving state to a cutoff state, and a switching device cutoff failure determiner that is configured in such a way as to determine a failure in the switching device cutoff switcher. When the switching device cutoff failure determiner determines a failure in the switching device cutoff switcher, the current command or the voltage command is set in such a way that letting T1 denote output torque based on the first armature winding at a time when the switching device is in the driving state, letting T1off denote output torque based on the first armature winding at a time when the switching device is in the cutoff state, and letting T2 denote output torque produced based on the second armature winding, the T2 is larger than −T1 but smaller than −T1off or larger than −T1off but smaller than −T1; therefore, both the sum of the output torques produced in the driving state and the sum of the output torques produced in the cutoff state decrease and hence the output torque can be suppressed to fall within the mechanical loss even when a larger current is made to flow; thus, the failure determination can be performed in the state where behavior is not likely to occur.

BEST MODE FOR CARRYING OUT THE INVENTION

Embodiment 1

Figure 1:
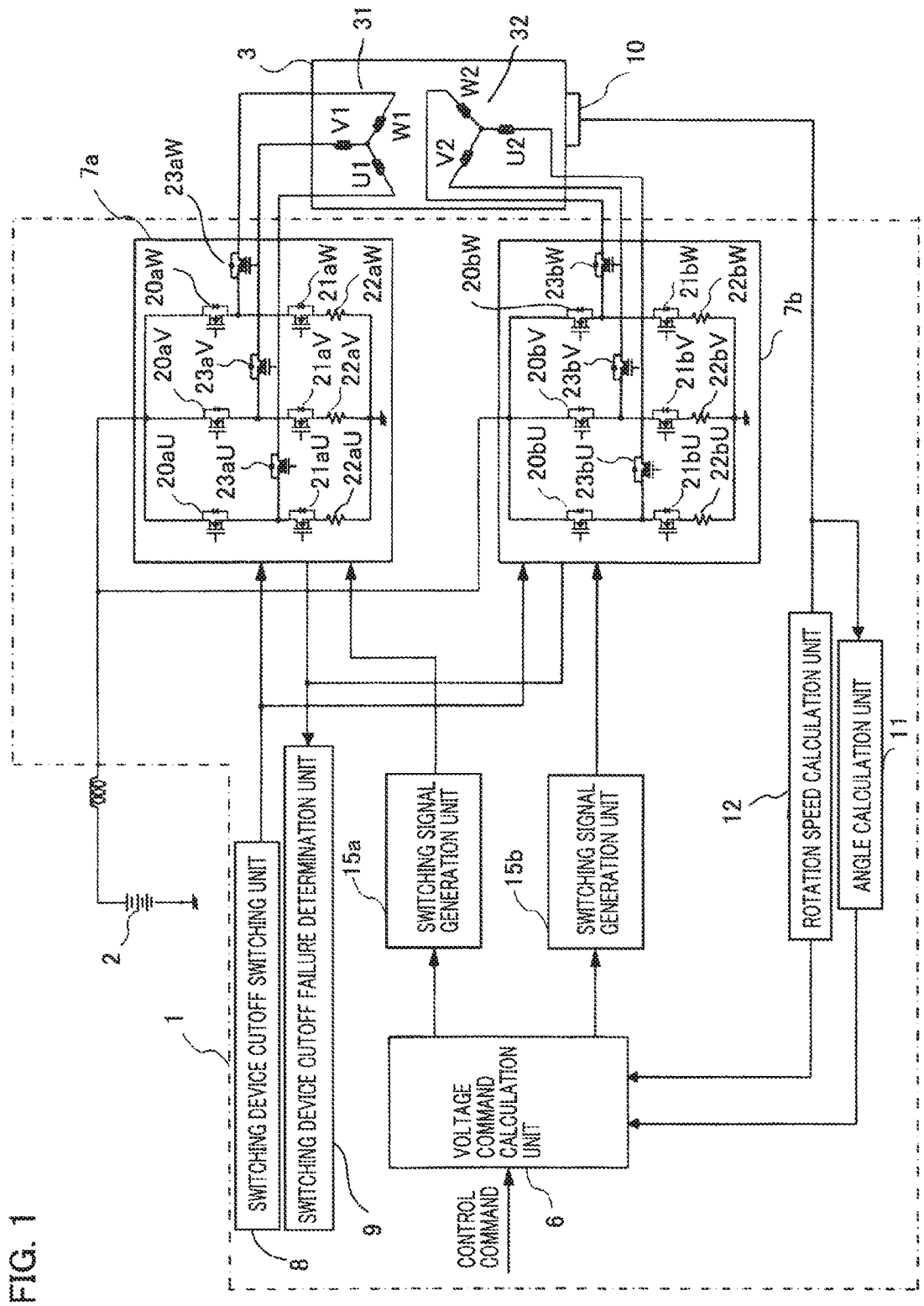
FIG. 1 is an overall configuration diagram representing a rotating-electric-machine control apparatus according to Embodiment 1 of the present invention.

FIG. 1 is a diagram representing the overall configuration of a rotating-electric-machine control apparatus according to Embodiment 1 of the present invention. In FIG. 1, a rotating-electric-machine control apparatus according to Embodiment 1 of the present invention is configured in such a way that as described later, a control unit 1 controls a rotating electric machine 3.

A DC power source 2 outputs a DC voltage Vdc to a first voltage applying unit 7a as a first voltage applying device and a second voltage applying unit 7b as a second voltage applying device. The DC power source 2 may be configured with any one of apparatuses, such as a battery, a DC-DC converter, a diode rectifier, and a PWM rectifier, that each output a DC voltage.

The rotating electric machine 3 has a first armature winding including three-phase windings, i.e., a U1-phase winding, a V1-phase winding, and a W1-phase winding and a second armature winding including three-phase windings, i.e., a U2-phase winding, a V2-phase winding, and a W2-phase winding; in each of the first armature winding 31 and the second armature winding 32, the windings of the respective phases are combined with one another through star connection; the rotating electric machine 3 has a stator (unillustrated) configured with these three-phase windings.

The rotating electric machine 3 is configured with the stator, a rotor (unillustrated), and a rotation axle (unillustrated) fixed to the rotor.

In the following explanation, as an example, there will be described the case where the present invention is applied to a permanent-magnet synchronous AC rotating electric machine in which the armature winding is configured with respective windings of three phases and in which permanent magnets are arranged in the rotor; however, because the present invention can be applied to a rotating electric machine that is driven to rotate by a multi-phase alternating current, an induction machine or a magnetic-field-winding synchronous machine may also be utilized. In addition, in the present embodiment, each of the first armature winding 31 and the second armature winding 32 is a star-connection type; however, even when each thereof is a delta-connection type, the same effect can be demonstrated.

A voltage command calculation unit 6 as a voltage command calculator calculates first voltage commands Vu1, Vv1, and Vw1 and then outputs them to a first switching signal generation unit 15a as a first switching signal generator; concurrently, the voltage command calculation unit 6 calculates second voltage commands Vu2, Vv2, and Vw2 and then outputs them to a second switching signal generation unit 15b as a second switching signal generator.

As the calculation method for the first voltage commands Vu1, Vv1, and Vw1, there is utilized, for example, a current feedback control method in which the first voltage commands Vu1, Vv1, and Vw1 are calculated through proportional-integral control so that the difference between a current command and each corresponding one of a U1-phase current Iu1, a V1-phase current Iv1, and a W1-phase current Iw1 that flow in the respective three-phase windings of the first armature winding 31 is made to become zero. The U1-phase current Iu1, the V1-phase current Iv1, and the W1-phase current Iw1 that flow in the respective three-phase windings of the first armature winding 31 are obtained by use of an existing current detection unit such as an after-mentioned shunt resistor. In the feed-forward control or the control utilizing an estimation value, it is not necessarily required to input the U1-phase current Iu1, the V1-phase current Iv1, and the W1-phase current Iw1 to the voltage command calculation unit 6.

As the calculation method for the second voltage commands Vu2, Vv2, and Vw2, there is utilized, for example, a current feedback control method in which the second voltage commands Vu2, Vv2, and Vw2 are calculated through proportional-integral control so that the difference between a current command and each corresponding one of a U2-phase current Iu2, a V2-phase current Iv2, and a W2-phase current Iw2 that flow in the respective three-phase windings of the second armature winding 32 is made to become zero. The U2-phase current Iu2, the V2-phase current Iv2, and the W2-phase current Iw2 that flow in the respective three-phase windings of the second armature winding 32 are obtained by use of an existing current detection unit as a existing current detector such as an after-mentioned shunt resistor. In the feed-forward control or the control utilizing an estimation value, it is not necessarily required to input the U2-phase current Iu2, the V2-phase current Iv2, and the W2-phase current Iw2 to the voltage command calculation unit 6.

Based on the first voltage commands Vu1, Vv1, and Vw1 outputted from the voltage command calculation unit 6, the first switching signal generation unit 15a performs pulse width modulation (PWM modulation) so as to output first switching signals Qup1, Qvp1, Qwp1, Qun1, Qvn1, and Qwn1 that have respective pulse widths corresponding to the first voltage commands Vu1, Vv1, and Vw1. It goes without saying that the first switching signals Qup1, Qvp1, Qwp1, Qun1, Qvn1, and Qwn1 may be generated from voltages Vu11, Vv11, and Vw11 obtained by applying a well-known modulation method such as the spatial vector modulation or the two-phase modulation to the first voltage commands Vu1, Vv1, and Vw1.

Based on the first switching signals Qup1, Qvp1, Qwp1, Qun1, Qvn1, and Qwn1, the first voltage applying unit 7a performs on/off-operation of a U-phase upper arm switching device 20aU, a V-phase upper arm switching device 20aV, a W-phase upper arm switching device 20aW, a U-phase lower arm switching device 21aU, a V-phase lower arm switching device 21aV, and a W-phase lower arm switching device 21aW so as to convert a DC voltage inputted from the DC power source 2 into an AC voltage and then applies the AC voltage to the three-phase windings U1, V1, and W1 of the first armature winding 31 in the rotating electric machine 3. The group of the U-phase upper arm switching device 20aU, the V-phase upper arm switching device 20aV, and the W-phase upper arm switching device 20aW and the group of the U-phase lower arm switching device 21aU, the V-phase lower arm switching device 21aV, and the W-phase lower arm switching device 21aW configure a three-phase inverter circuit based on a three-phase bridge circuit.

As each of the U-phase upper arm switching device 20aU, the V-phase upper arm switching device 20aV, the W-phase upper arm switching device 20aW, the U-phase lower arm switching device 21aU, the V-phase lower arm switching device 21aV, and the W-phase lower arm switching device 21aW, there is utilized, for example, a power module in which a switching device such as an IGBT, a bipolar transistor, or a MOS power transistor and a diode are connected with each other in an anti-parallel manner.

First current detection units 22aU, 22aV, and 22aW are configured with respective shunt resistors connected with the U-phase lower arm switching device 21aU, the V-phase lower arm switching device 21aV, and the W-phase lower arm switching device 21aW, respectively, of the first voltage applying unit 7a; based on the respective inter-terminal voltages thereof, the U1-phase current Iu1, the V1-phase current Iv1, and the W1-phase current Iw1 are detected.

Based on the second voltage commands Vu2, Vv2, and Vw2 outputted from the voltage command calculation unit 6, the second switching signal generation unit 15b performs pulse width modulation (PWM modulation) so as to output second switching signals Qup2, Qvp2, Qwp2, Qun2, Qvn2, and Qwn2 that have respective pulse widths corresponding to the second voltage commands Vu2, Vv2, and Vw2. It goes without saying that the second switching signals Qup2, Qvp2, Qwp2, Qun2, Qvn2, and Qwn2 may be generated from voltages Vu21, Vv21, and Vw21 obtained by applying a well-known modulation method such as the spatial vector modulation or the two-phase modulation to the second voltage commands Vu2, Vv2, and Vw2.

Based on the second switching signals Qup2, Qvp2, Qwp2, Qun2, Qvn2, and Qwn2, the second voltage applying unit 7b performs on/off-operation of a U-phase upper arm switching device 20bU, a V-phase upper arm switching device 20bV, a W-phase upper arm switching device 20bW, a U-phase lower arm switching device 21bU, a V-phase lower arm switching device 21bV, and a W-phase lower arm switching device 21bW so as to convert the DC voltage inputted from the DC power source 2 into an AC voltage and then applies the AC voltage to the three-phase windings U2, V2, and W2 of the second armature winding 32 in the rotating electric machine 3. The group of the U-phase upper arm switching device 20bU, the V-phase upper arm switching device 20bV, and the W-phase upper arm switching device 20bW and the group of the U-phase lower arm switching device 21bU, the V-phase lower arm switching device 21bV, and the W-phase lower arm switching device 21bW configure a three-phase inverter circuit based on a three-phase bridge circuit.

As each of the U-phase upper arm switching device 20bU, the V-phase upper arm switching device 20bV, the W-phase upper arm switching device 20bW, the U-phase lower arm switching device 21bU, the V-phase lower arm switching device 21bV, and the W-phase lower arm switching device 21bW, there is utilized, for example, a power module in which a switching device such as an IGBT, a bipolar transistor, or a MOS power transistor and a diode are connected with each other in an anti-parallel manner.

Second current detection units 22bU, 22bV, and 22bW are configured with respective shunt resistors connected with the U-phase lower arm switching device 21bU, the V-phase lower arm switching device 21bV, and the W-phase lower arm switching device 21bW, respectively, of the second voltage applying unit 7b; based on the respective inter-terminal voltages thereof, the U2-phase current Iu2, the V2-phase current Iv2, and the W2-phase current Iw2 are detected.

When for example, an abnormality is detected through an initial check at a time of starting or from various kinds of input signals, a switching device cutoff switching unit 8 as a switching device cutoff switcher forcibly switches any one of the group of the U-phase upper arm switching device 20aU, the V-phase upper arm switching device 20aV, the W-phase upper arm switching device 20aW, the U-phase lower arm switching device 21aU, the V-phase lower arm switching device 21aV, and the W-phase lower arm switching device 21aW in the first voltage applying unit 7a and the group of the U-phase upper arm switching device 20bU, the V-phase upper arm switching device 20bV, the W-phase upper arm switching device 20bW, the U-phase lower arm switching device 21bU, the V-phase lower arm switching device 21bV, and the W-phase lower arm switching device 21bW in the second voltage applying unit 7b from a driving state into a cutoff state.

As described later, a switching device cutoff failure determination unit 9 as a switching device cutoff failure determiner determines a failure in the switching device cutoff switching unit 8, based on a current or a voltage.

An angle information detection unit 10 outputs angular information, such as a rotation angle θ or a rotation speed ω of the rotor of the rotating electric machine 3 or a detection signal that changes in accordance with the rotation angle, to an angle calculation unit 11 and a rotation speed calculation unit 12.

As the angle information detection unit 10, there can be utilized a rotation detector of an electromagnetic type, a magnetoelectric type, or a photoelectric type or a position detector such as a hole device, a TMR device, a GMR device, or a resolver. Based on a signal obtained by the angle information detection unit 10, the angle calculation unit 11 calculates a rotation angle of the rotor and then outputs the rotation angle to the voltage command calculation unit 6. When the signal to be obtained by the angle information detection unit 10 is a rotation speed ω, the rotation angle of the rotor may be calculated, for example, by integrating the rotation speed ω.

Based on a signal obtained by the angle information detection unit 10, the rotation speed calculation unit 12 calculates a rotation speed of the rotor and then outputs the rotation speed to the voltage command calculation unit 6. When the signal to be obtained by the angle information detection unit 10 is an angle, the rotation angle can be calculated, for example, by differentiating the angle θ or by use of the difference between the present angle value and the immediately previous angle value. It may be allowed that when there exists an error in the signal obtained by the angle information detection unit 10, the signal is corrected through a well-known method.

Next, there will be explained a method in which at an electric angle of 210 [deg], the switching device cutoff failure determination unit 9 determines whether or not there exists a failure in the switching device cutoff switching unit 8.

Figure 2:
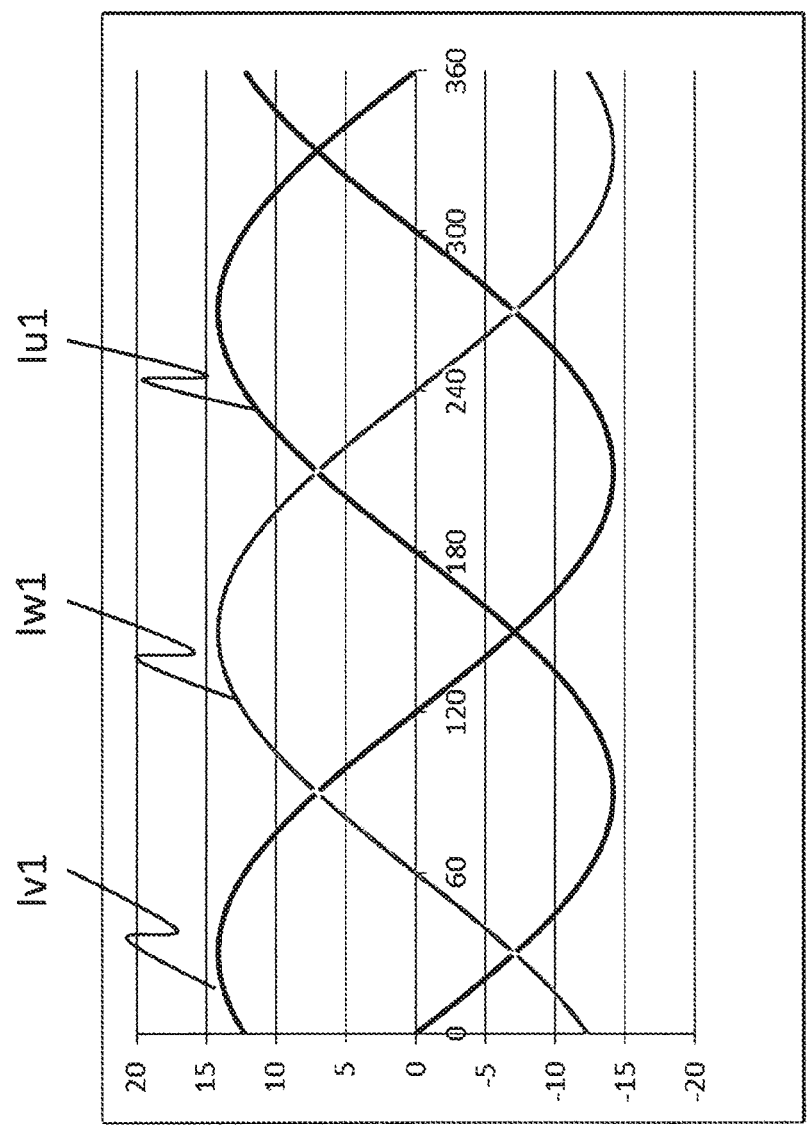
FIG. 2 is an explanatory chart representing three-phase currents flowing in a first armature winding during one electric-angle period, in the rotating-electric-machine control apparatus according to Embodiment 1 of the present invention.

FIG. 2 is an explanatory chart representing three-phase currents flowing in the first armature winding during one electric-angle period, in the rotating-electric-machine control apparatus according to Embodiment 1 of the present invention. In the case where in a rotating biaxial coordinate system including a d axis and a q axis, the d-axis current Id1 and the q-axis current Iq1 of the first armature winding 31 are 0 [A] and $10\sqrt{3}$ [A], respectively, the U1-phase current Iu1, the V1-phase current Iv1, and the W1-phase current Iw1 during the electric angle of 360 [deg] are represented as in FIG. 2. In FIG. 2, at the electric angle of 210 [deg], each of the U1-phase current Iu1 and the W1-phase current Iw1 is $5\sqrt{2}$ [A], and the V1-phase current Iv1 is $-10\sqrt{2}$ [A]. In the case where the rotor rotates minutely, there exists almost no difference between the respective phases of the voltage and the current; thus, letting R denote the resistance value of the three-phase winding, three-phase voltage commands Vu1, Vv1, and Vw1 are given by the equation (1) below.

$$\begin{cases} V_{u1} = RI_{u1} \\ V_{v1} = RI_{v1} \\ V_{w1} = RI_{w1} \end{cases} \quad (1)$$

Figure 3:
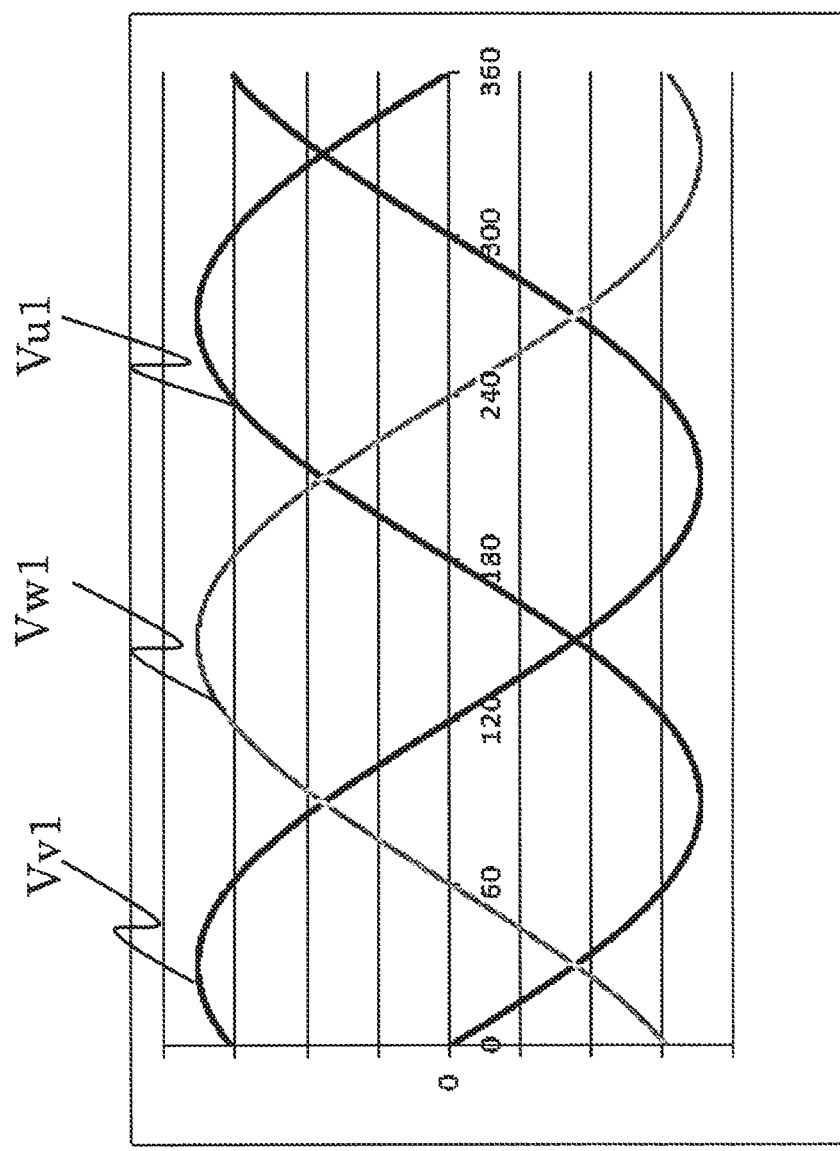
FIG. 3 is an explanatory chart representing voltage commands for the first armature winding during one electric-angle period, in the rotating-electric-machine control apparatus according to Embodiment 1 of the present invention.

FIG. 3 is an explanatory chart representing the voltage commands for the first armature winding during one electric-angle period, in the rotating-electric-machine control apparatus according to Embodiment 1 of the present invention; the ordinate denotes the voltage, and the abscissa denotes the electric angle. The three-phase voltage commands Vu1, Vv1, and Vw1 obtained by the equation (1) are represented as in FIG. 3.

In the case where in the foregoing driving state in which the U1-phase current Iu1, the V1-phase current Iv1, and the W1-phase current Iw1 flow, the switching device cutoff switching unit 8 brings the U-phase upper arm switching device 20aU into the cutoff state, the application voltage for the U1-phase winding becomes the neutral-point voltage, and the current that has been flowing in the U1-phase winding flows from the W1-phase winding to the V1-phase winding; then, a U1-phase current Iu1off, a V1-phase current Iv1off, and a W1-phase current Iw1off become 0 [A], $-15/\sqrt{2}$ [A], and $15/\sqrt{2}$ [A], respectively.

In the following explanation, the state where the U-phase upper arm switching device 20aU for the first armature winding 31 is driven will simply be referred to as a "driving state", and the state where the U-phase upper arm switching device 20aU for the first armature winding 31 is cut off will simply be referred to as a "cutoff state".

In the cutoff state, application voltages Vu1off, Vv1off, and Vw1off for the windings of the respective phases can be given by the equation (2) below.

$$\begin{cases} V_{u1off} = \dfrac{V_{v1} + V_{w1}}{2} \\ V_{v1off} = V_{v1} \\ V_{w1off} = V_{w1} \end{cases} \quad (2)$$

Because in the relationship between the dq-axes currents and the three-phase currents, the equation (3) below is established, the d-axis current id1off and the q-axis current Iq1off in the cutoff state are 15/2 [A] and $15\sqrt{3}/2$ [A], respectively.

$$\begin{pmatrix} I_d \\ I_q \end{pmatrix} = \sqrt{\dfrac{2}{3}} \begin{pmatrix} \cos\theta & \sin\theta \\ -\sin\theta & \cos\theta \end{pmatrix} \begin{pmatrix} 1 & -\dfrac{1}{2} & -\dfrac{1}{2} \\ 0 & \dfrac{\sqrt{3}}{2} & -\dfrac{\sqrt{3}}{2} \end{pmatrix} \begin{pmatrix} I_u \\ I_v \\ I_w \end{pmatrix} \quad (3)$$

In this situation, letting P, ϕ, Kt denote the number of pole pairs, the magnetic flux, and the torque constant, an output torque t1 at a time when the first armature winding 31 is in the driving state is given by the equation (4) below. In this description, for simplicity, the equation (4) is for the case where there exists no reluctance torque; however, it goes without saying that even when there exists reluctance torque, the same effect can be obtained.

$$T_1 = PI_{q1}\phi = K_t I_{q1} \quad (4)$$

In the case where the first armature winding 31 is in the cutoff state, the output torque T1off is given by the equation (5) below.

$$T_{1off} = PI_{q1off}\phi = K_t I_{q1off} \quad (5)$$

In contrast, letting Id2 and Iq2 denote the d-axis current and the q-phase current, respectively, in the second armature winding 32, an output torque t2 at a time when the second armature winding 32 is in the driving state is given by the equation (6) below.

$$T_2 = PI_{q2}\phi = K_t I_{q2} \quad (6)$$

In this situation, in the case where each of the first armature winding 31 and the second armature winding 32 is in the driving state, an output torque Tall of the rotating electric machine 3 is given by the equation (7) below.

$$T_{all} = T_1 + T_2 = P\phi(I_{q1} + I_{q2}) \quad (7)$$

In the case where the first armature winding 31 is in the cutoff state and the second armature winding 32 is in the driving state, an output torque Tall_off of the rotating electric machine 3 is given by the equation (8) below.

$$T_{all\_off} = T_{1off} + T_2 = P\phi(I_{q1off} + I_{q2}) \quad (8)$$

In the case where both the first armature winding 31 and the second armature winding 32 are in the driving state, the output torque Tall of the rotating electric machine 3 is the sum of the output torque T1 of the first armature winding 31 and the output torque T2 of the second armature winding 32; therefore, when the relationship between the output torque T1 of the first armature winding 31 and the output torque T2 of the second armature winding 32 satisfies the equation (9) below, the output torque Tall of the rotating electric machine 3 is 0.

$$T_1+T_2=0 \quad (9)$$

Figure 4:
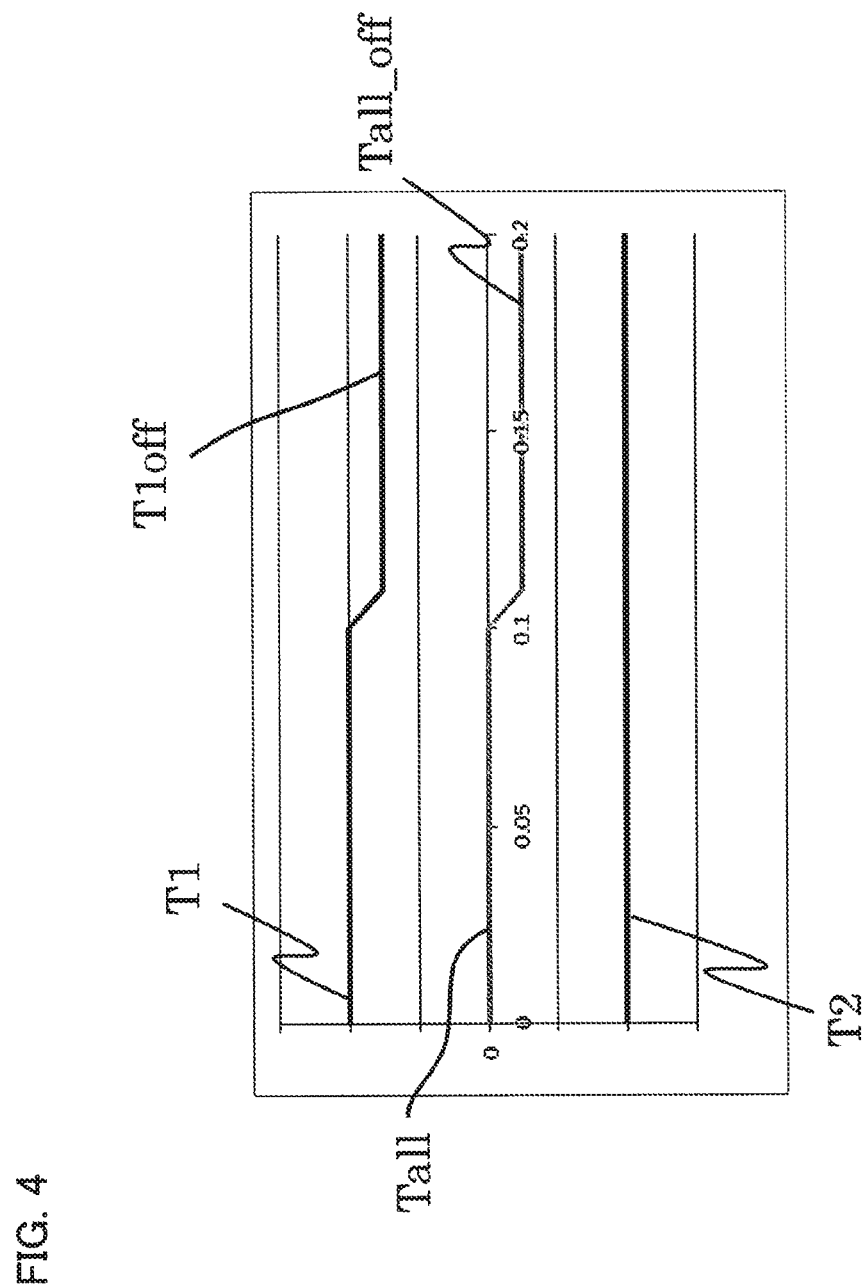
FIG. 4 is an explanatory chart representing output torque at a time when a driving state is switched into a cutoff state at an electric angle of 210 [deg], in the rotating-electric-machine control apparatus according to Embodiment 1 of the present invention.

FIG. 4 is an explanatory chart representing output torque at a time when the driving state is switched into the cutoff state at the electric angle of 210 [deg], in the rotating-electric-machine control apparatus according to Embodiment 1 of the present invention; the ordinate denotes the torque, and the abscissa denotes the time point. In the case of the foregoing electric angle of 210 [deg], as represented in FIG. 4, both the first armature winding 31 and the second armature winding 32 are in the driving state in the period from the time point "0" to the time point "0.1"; because the absolute value of the output torque T1 produced by the first armature winding 31 and the absolute value of the output torque T2 produced by the second armature winding 32 are set in such a way as to become equal to each other, the output toque Tall of the rotating electric machine 3, which is the sum of the output torque T1 and the output torque T2, becomes "0".

At the time point "0.1", the U-phase upper arm switching device 20aU for the first armature winding 31 is brought into the cutoff state; in the period after and including the time point "0.1", the cutoff state is continued. In the cutoff state, the output torque Tall_off of the rotating electric machine 3, which is the sum of the output torque T1off produced by the first armature winding 31 and the output torque T2 produced by the second armature winding 32, is a value smaller than "0".

As represented in FIG. 4, when determination on a failure in the switching device cutoff switching unit 8 is performed, each of the output torques Tall and Tall_off of the rotating electric machine 3 can be suppressed in such a way that the absolute values thereof are smaller than the respective absolute values of the output torque T1 of the first armature winding 31 and the output torque T2 of the second armature winding 32. Accordingly, when the current commands or the voltage commands are determined in such a way as to satisfy the foregoing equation (9), there can be realized a state where the rotor of the rotating electric machine 3 does not rotate, even when both the first armature winding 31 and the second armature winding 32 are in the driving state and currents are flowing in the respective armature windings; thus, because the time of the driving state before the state of the first armature winding 31 is switched into the cutoff state can sufficiently be secured, there can be obtained an effect that the current can stably be applied, which is unprecedented in conventional apparatuses.

A q-axis current command Iq1* for the first armature winding 31 can be determined by dividing the output torque T1 produced by the first armature winding 31 by the torque constant Kt; a q-axis current command Iq2* for the second armature winding 32 can be determined by dividing the output torque T2 produced by the second armature winding 32 by the torque constant Kt.

When the relationship between the q-axis current command Iq1* for the first armature winding 31 and the q-axis current command Iq2* for the second armature winding 32 satisfies the equation (10) below, the output torque Tall of the rotating electric machine 3 is 0. When the current commands satisfy the equation (10), there can be obtained an effect that even when currents are flowing in the driving state, the state where the rotor does not rotate can be realized, which is unprecedented in conventional apparatuses.

$$I_{q1}^* + I_{q2}^* = 0 \quad (10)$$

Moreover, in the case where the rotor of the rotating electric machine 3 minutely rotates, the current and the voltage are proportional to each other; thus, also when the voltage commands satisfy the equation (11) below, there can be obtained an effect that even when both the first armature winding 31 and the second armature winding 32 are in the driving state and currents are flowing, the state where the rotor does not rotate can be realized, which is unprecedented.

$$V_{q1} + V_{q2} = 0 \quad (11)$$

In the case where there exists no phase difference between the respective dispositions of the first armature winding 31 and the second armature winding 32, the same current may be made to flow in each of the windings of the corresponding phases so that the same q-axis currents flow; thus, when the voltage commands satisfy the equation (12) below, there can be obtained an effect that even when both the first armature winding 31 and the second armature winding 32 are in the driving state and currents are flowing, the state where the rotor does not rotate can be realized, which is unprecedented in conventional apparatuses. Also in the case where the phase difference between the respective dispositions of the first armature winding 31 and the second armature winding 32 is 60n (n: natural number) [deg], the same effect can be obtained by making the respective currents of the corresponding phases coincide with each other.

$$\begin{cases} V_{u1} + V_{u2} = 0 \\ V_{v1} + V_{v2} = 0 \\ V_{w1} + V_{w2} = 0 \end{cases} \quad (12)$$

In the case where there exists a phase difference of 30 [deg] between the respective dispositions of the first armature winding 31 and the second armature winding 32, the voltage commands are made to satisfy the following equation (13) in which the phase difference is corrected, so that there can be obtained an effect that even when both the first armature winding 31 and the second armature winding 32 are in the driving state and currents are flowing, the state where the rotor does not rotate can be realized, which is unprecedented in conventional apparatuses. Also in the case where the phase difference between the respective dispositions of the first armature winding 31 and the second armature winding 32 is 30+60n (n: natural number) [deg], the same effect can be obtained by making the respective currents of the corresponding phases coincide with each other.

$$\begin{cases} V_{u1} + \dfrac{V_{u2} - V_{v2}}{\sqrt{3}} = 0 \\ V_{v1} + \dfrac{V_{v2} - V_{w2}}{\sqrt{3}} = 0 \\ V_{w1} + \dfrac{V_{w2} - V_{u2}}{\sqrt{3}} = 0 \end{cases} \quad (13)$$

Meanwhile, there exists a mechanical loss Tloss in a mechanism mounted on the rotating electric machine 3 or the output axle of the rotating electric machine 3 by means of a gear or a chain. When the equation (14) is satisfied, the output torque of the rotating electric machine 3 at a time when both the first armature winding 31 and the second armature winding 32 are in the driving state is within the mechanical loss; therefore, the rotor of the rotating electric machine 3 does not rotate.

$$|T_1+T_2| T_{loss} \qquad (14)$$

When the respective signs of the output torque T1 and the output torque T2 are the same as each other, the output torque of the rotating electric machine 3 increases and hence the margin for being within the mechanical loss Tloss decreases, i.e., the output torque of the rotating electric machine 3 is likely to exceed the mechanical loss Tloss; however, when the respective signs of the output torque T1 and the output torque T2 are different from each other, the output torque of the rotating electric machine 3 decreases and hence the margin for being within the mechanical loss Tloss increases, i.e., the output torque of the rotating electric machine 3 is not likely to exceed the mechanical loss Tloss.

Figure 5:
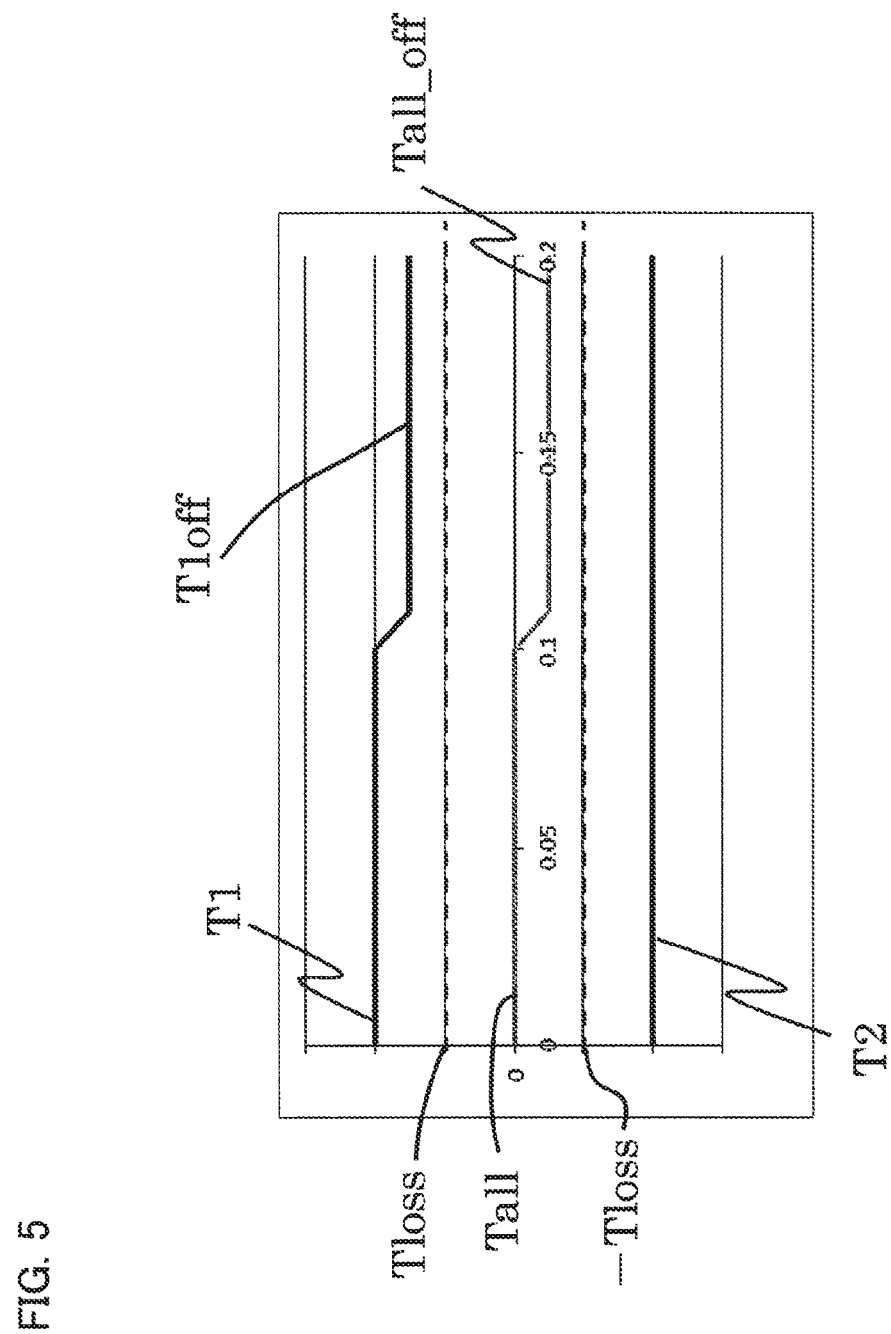
FIG. 5 is an explanatory chart representing the relationship between mechanical losses and the output torques at a time when the driving state is switched into the cutoff state at the electric angle of 210 [deg], in the rotating-electric-machine control apparatus according to Embodiment 1 of the present invention.

FIG. 5 is an explanatory chart representing output torque at a time when the driving state is switched into the cutoff state at the electric angle of 210 [deg], in the rotating-electric-machine control apparatus according to Embodiment 1 of the present invention; the ordinate denotes the torque, and the abscissa denotes the time point. In the case of the foregoing electric angle of 210 [deg], as represented in FIG. 5, both the first armature winding 31 and the second armature winding 32 are in the driving state in the period from the time point "0" to the time point "0.1"; because the absolute value of the output torque T1 produced by the first armature winding 31 and the absolute value of the output torque T2 produced by the second armature winding 32 are set in such a way as to become equal to each other, the output toque Tall of the rotating electric machine 3, which is the sum of the output torque T1 and the output torque T2, becomes "0".

At the time point "0.1", the U-phase upper arm switching device 20aU for the first armature winding 31 is brought into the cutoff state; in the period after and including the time point "0.1", the cutoff state is continued. In the cutoff state, the output torque Tall_off of the rotating electric machine 3, which is the sum of the output torque T1off produced by the first armature winding 31 and the output torque T2 produced by the second armature winding 32, is a value smaller than "0". The mechanical loss Tloss always exists in each of the "+" side and the "−" side; however, it can be seen that each of the output torque Tall in the driving state and the output torque Tall_off in the cutoff state is smaller than the absolute value of the mechanical loss Tloss.

As evident from FIG. 5, each of the absolute values of the output torques T1 and T1off produced by the first armature winding 31 and the output torque T2 produced by the second armature winding 32 is larger than the mechanical loss Tloss, but each of the absolute values of the output torques Tall and Tall_off of the rotating electric machine 3, each of which is the sum of torques produced by the two armature windings, is smaller than the absolute value of the mechanical loss Tloss; therefore, the rotor of the rotating electric machine 3 does not rotate. In other words, when the current commands or voltage commands are determined in such a way that the respective signs of the output torque T1 and the output torque T2 are opposite to each other, there can be obtained an effect that even when currents are flowing in the driving state, the state where the rotor does not rotate can be realized, which is unprecedented in conventional apparatuses.

The equation (15) below is a relational equation for determining the current commands in the same manner as the foregoing equations (10) and (11) in such a way that the output torque of the rotating electric machine 3 in the driving state falls within the mechanical loss; the equation (16) below is a relational equation for determining the voltage commands.

$$|I_{q1}^* + I_{q2}^*| < \frac{T_{loss}}{K_t} \qquad (15)$$

$$|V_{q1} + V_{q2}| < \frac{RT_{loss}}{K_t} \qquad (16)$$

As represented by the foregoing example with the electric angle of 210 [deg], when in the driving state where the U1-phase current Iu1 flows in the first armature winding 31, the switching device cutoff switching unit 8 switches the U-phase upper arm switching device 20aU from the driving state to the cutoff state, the U1-phase current does not flow. As a result, the current to be obtained by use of the current detection unit formed of the shunt resistor 22aU changes; thus, it is made possible to perform a determination on a failure in the switching device cutoff switching unit for the U-phase upper arm switching device 20aU.

In Embodiment 1, the current detection unit detects a current flowing in the lower-potential-side switching device, i.e., the lower-arm switching device; however, it may be allowed that a current flowing in the higher-potential-side switching device, i.e., the upper-arm switching device. Moreover, it goes without saying that the same effect can be obtained by detecting a current flowing in the armature winding.

Because the terminal voltage of the first armature winding 31 is given by the foregoing equation (1) in the driving state and is given by the foregoing equation (2) in the cutoff state, the terminal voltage of the rotating electric machine 3 changes at a time when the state of the first armature winding 31 is switched from the driving state to the cutoff state.

In the case where the first armature winding 31 is in the driving state, the sum of the terminal voltages of the respective phases is given by the equation (17) below.

$$V_{sum} = V_{u1} + V_{v1} + V_{w1} \qquad (17)$$

In the case where the first armature winding 31 is in the cutoff state, the sum of the terminal voltages of the respective phases is given by the equation (18) below.

$$V_{sum\_off} = \tfrac{3}{2}(V_{v1} + V_{w1}) \qquad (18)$$

Accordingly, the switching device cutoff failure determination unit 9 can determine a failure in the switching device cutoff switching unit, based on the terminal voltage of the rotating electric machine 3, the sum of the terminal voltages, the average value of the terminal voltages, or the neutral-point voltage.

The three-phase current in the cutoff state changes from the three-phase current in the driving state; thus, when in the voltage command calculation unit 6, the detection current value is fed back and the voltage command is calculated, the proportional-integral control may make the voltage command grow up to the maximum value, because the difference between the current command and the detection current value is large. Accordingly, in the cutoff state, the voltage command is calculated without feeding back the detection current value, so that it is made possible to prevent the effect of the current change due to the cutoff from being reflected in the next voltage command.

Furthermore, the voltage command in the driving state at a time immediately before the switching device cutoff switching unit 8 issues a switching indication for the cutoff state is held even after the switching indication for the cutoff state has been issued, so that a simple unit can prevent the effect of the current change due to the cutoff from being reflected in the next voltage command.

In the foregoing explanation, there has been described the case where the U-phase upper arm switching device 20aU in the first voltage applying unit 7a for supplying electric power to the first armature winding 31 is made to be in the cutoff state so that a failure in the U-phase upper arm switching device 20aU is determined; however, the failure determination can be performed in the same manner as describe above, for example, in a sequential manner also for all the other switching devices in the first voltage applying unit 7a and for all the switching devices in the second voltage applying unit 7b for applying a voltage to the second armature winding 32.

It is made possible to configure an electric power steering apparatus that produces torque for assisting steering torque, by use of the rotating-electric-machine control apparatus according to Embodiment 1 of the present invention, described above. As is well known, output torque produced by an electric power steering apparatus is transferred onto the handwheel axle of a vehicle through a gear or a chain and may operate as a torque ripple or self-rotating torque that discomforts a user. In contrast, in the electric power steering apparatus equipped with the rotating-electric-machine control apparatus according to Embodiment 1 of the present invention, the output torque produced at a time when the switching device cutoff switching unit issues an indication for switching the state of the switching device to the cutoff state is made to fall within the mechanical loss, so that it is made possible to obtain an unprecedented effect that user's feeling of discomfort is reduced.

Embodiment 2

Next, a rotating-electric-machine control apparatus according to Embodiment 2 of the present invention and an electric power steering apparatus equipped with the rotating-electric-machine control apparatus will be explained. In Embodiment 1, there has been described a method in which in the driving state at a time immediately before the switching device cutoff switching unit issues an indication for switching the state of the switching device to the cutoff state, the output torque T all of the rotating electric machine 3 is made to be "0" so that a behavior change of the rotating electric machine is suppressed; however, the rotating-electric-machine control apparatus according to Embodiment 2 of the present invention is configured in such a way that the output torque Tall of the rotating electric machine 3 in the cutoff state is made to be "0" so that the behavior change of the rotating electric machine is suppressed. The other configurations are the same as those in Embodiment 1.

In the case where after switching into the cutoff state, a failure in the switching device cutoff switching unit is determined, in many cases, determination operation is implemented two or more times in order to prevent an erroneous determination and then when the counting value of a counter that counts up each time the failure condition is established becomes the same as or larger than a predetermined threshold value, the "failure" is determined. Because the output torque Tall_off of the rotating electric machine 3 in the cutoff state is the sum of the output torque T1 off produced by the first armature winding 31 and the output torque T2 produced by the second armature winding 32, the output torque Tall_off of the rotating electric machine 3 in the driving state becomes "0", when the relationship between the output torque T1 off and the output torque T2 satisfies the equation (19) below.

$$T_{1off}+T_2=0 \qquad (19)$$

Figure 6:
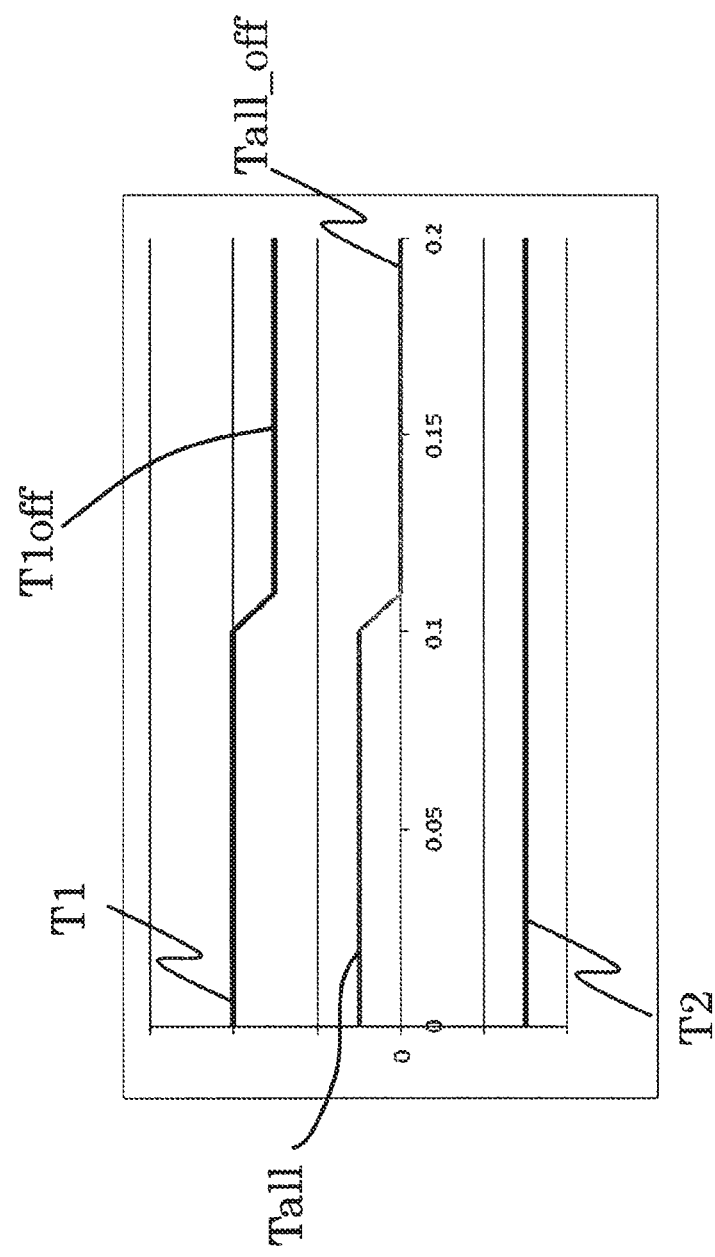
FIG. 6 is an explanatory chart representing output torque at a time when the driving state is switched into the cutoff state at the electric angle of 210 [deg], in a rotating-electric-machine control apparatus according to Embodiment 2 of the present invention.

FIG. 6 is an explanatory chart representing output torque at a time when the driving state is switched into the cutoff state at the electric angle of 210 [deg], in the rotating-electric-machine control apparatus according to Embodiment 2 of the present invention; the ordinate denotes the torque, and the abscissa denotes the time point. In the case of the foregoing electric angle of 210 [deg], as represented in FIG. 6, both the first armature winding 31 and the second armature winding 32 are in the driving state in the period from the time point "0" to the time point "0.1"; because the absolute value of the output torque T1 produced by the first armature winding 31 is set to be larger than the absolute value of the output torque T2 produced by the second armature winding 32, the output toque Tall of the rotating electric machine 3, which is the sum of the output torque T1 and the output torque T2, is larger than "0".

At the time point "0.1", the U-phase upper arm switching device 20aU for the first armature winding 31 is brought into the cutoff state; in the period after and including the time point "0.1", the cutoff state is continued. In the cutoff state, the output torque Tall_off of the rotating electric machine 3, which is the sum of the output torque T1off produced by the first armature winding 31 and the output torque T2 produced by the second armature winding 32, is "0".

As represented in FIG. 6, when determination on a failure in the switching device cutoff switching unit 8 is performed, each of the output torques Tall and Tall_off of the rotating electric machine 3 can be suppressed in such a way that the absolute values thereof are smaller than the respective absolute values of the output torque T1 of the first armature winding 31 and the output torque T2 of the second armature winding 32. Accordingly, when the current commands or the voltage commands are determined in such a way as to satisfy the foregoing equation (19), there can be realized a state where the rotor of the rotating electric machine 3 does not rotate, even when the first armature winding 31 is in the cutoff state and the second armature winding 32 is in the driving state and currents are flowing in the respective armature windings; thus, there can be obtained an effect that the time from a time point when the state of the first armature winding 31 is switched to the cutoff state to a time point when the failure is determined can sufficiently be secured, which is unprecedented in conventional apparatuses.

In contrast, when the equation (20) below is satisfied, the output torque of the rotating electric machine 3 in the cutoff state falls within the mechanical loss; thus, the rotating electric machine 3 does not rotate.

$$|T_{1off}+T_2|<T_{loss} \qquad (20)$$

Figure 7:
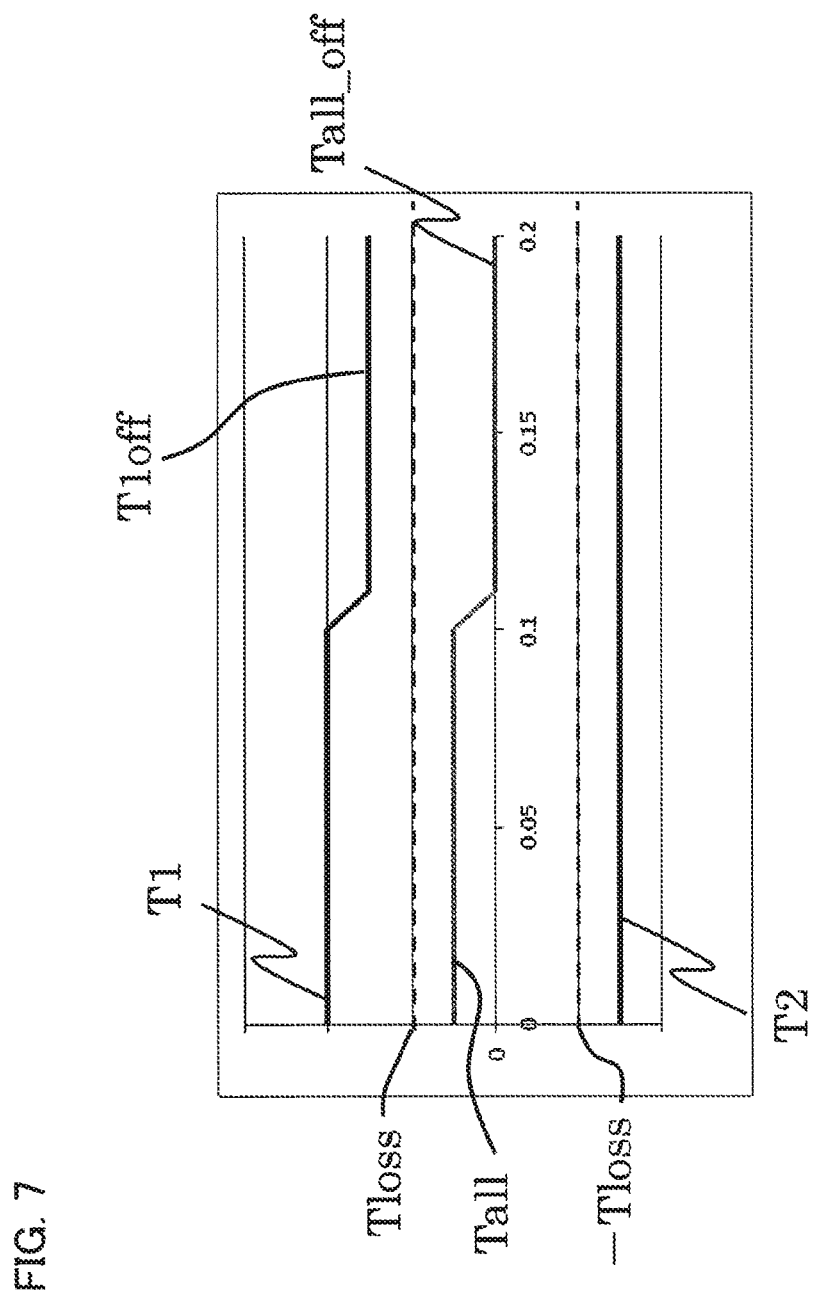
FIG. 7 is an explanatory chart representing the relationship between mechanical losses and the output torques at a time when the driving state is switched into the cutoff state at the electric angle of 210 [deg], in the rotating-electric-machine control apparatus according to Embodiment 2 of the present invention.

FIG. 7 is an explanatory chart representing the relationship between mechanical losses and the output torques at a time when the driving state is switched into the cutoff state at the electric angle of 210 [deg], in the rotating-electric-machine control apparatus according to Embodiment 2 of the present invention; the ordinate denotes the torque, and the abscissa denotes the time point. In the case of the foregoing electric angle of 210 [deg], as represented in FIG. 7, both the first armature winding 31 and the second armature winding 32 are in the driving state in the period from the time point "0" to the time point "0.1"; because the absolute value of the output torque T1 produced by the first armature winding 31 and the absolute value of the output torque T2 produced by the second armature winding 32 are set in such a way as to become equal to each other, the output toque Tall of the rotating electric machine 3, which is the sum of the output torque T1 and the output torque T2, becomes "0".

At the time point "0.1", the U-phase upper arm switching device 20aU for the first armature winding 31 is brought into the cutoff state; in the period after and including the time point "0.1", the cutoff state is continued. In the cutoff state, the output torque Tall_off of the rotating electric machine 3, which is the sum of the output torque T1off produced by the first armature winding 31 and the output torque T2 produced by the second armature winding 32, is "0". The mechanical loss Tloss always exists in each of the "+" side and the "−" side; however, it can be seen that each of the output torque Tall in the driving state and the output torque Tall_off in the cutoff state is smaller than the absolute value of the mechanical loss Tloss.

Accordingly, each of the absolute values of the output torques T1, T1off, and T2 is larger than the mechanical loss Tloss, but each of the absolute values of the output torques Tall and Tall_off of the rotating electric machine 3, each of which is the sum of torques produced by the two armature windings, is smaller than the absolute value of the mechanical loss Tloss; therefore, the rotor of the rotating electric machine 3 does not rotate. In other words, when the current commands or voltage commands are determined in such a way that the respective signs of the output torque T1off and the output torque T2 are opposite to each other, there can be obtained an effect that even when currents are flowing in the cutoff state, the state where the rotor does not rotate can be realized, which is unprecedented in conventional apparatuses.

It is made possible to configure an electric power steering apparatus that produces torque for assisting steering torque, by use of the rotating-electric-machine control apparatus according to Embodiment 2 of the present invention, described above. As is well known, output torque produced by an electric power steering apparatus is transferred onto the handwheel axle of a vehicle through a gear or a chain and may operate as a torque ripple or self-rotating torque that discomforts a user. In contrast, in the electric power steering apparatus equipped with the rotating-electric-machine control apparatus according to Embodiment 1 of the present invention, the output torque produced at a time when the switching device cutoff switching unit issues an indication for switching the state of the switching device to the cutoff state is made to fall within the mechanical loss, so that it is made possible to obtain an unprecedented effect that user's feeling of discomfort is reduced.

Embodiment 3

Next, a rotating-electric-machine control apparatus according to Embodiment 3 of the present invention and an electric power steering apparatus equipped with the rotating-electric-machine control apparatus will be explained. In Embodiment 1, in the driving state at a time immediately before the switching device cutoff switching unit issues an indication for switching the state of the switching device to the cutoff state, the behavior change of the rotating electric machine is suppressed; in Embodiment 2, in the cutoff state at a time after the switching device cutoff switching unit issues an indication for switching the state of the switching device to the cutoff state, the behavior change of the rotating electric machine is suppressed. However, in Embodiment 3 of the present invention, the behavior change of the rotating electric machine is suppressed both in the driving state and in the cutoff state. The other configurations are the same as those in Embodiment 1 or Embodiment 2.

In the case where the first armature winding 31 is in the driving state, the output torque Tall of the rotating electric machine 3 is given by the foregoing equation (7); the output torque Tall_off is given by the foregoing equation (8); Tall is not equal to Tall_off. In contrast, in order to make the absolute value of the output torque of the rotating electric machine 3 in the driving state and the absolute value of the output torque of the rotating electric machine 3 in the cutoff state equal to each other, i.e., in order to make |Tall| and |Tall_off| equal to each other, the equation (21) below should be satisfied.

$$T_2 = -\frac{T_1 + T_{1off}}{2} \quad (21)$$

In this situation, the output torque Tall in the driving state and the output torque Tall_off in the cutoff state are given by the equation (22).

$$\begin{cases} T_{all} = \dfrac{T_1 - T_{1off}}{2} \\ T_{all\_off} = -\dfrac{T_1 - T_{1off}}{2} \end{cases} \quad (22)$$

Figure 8:
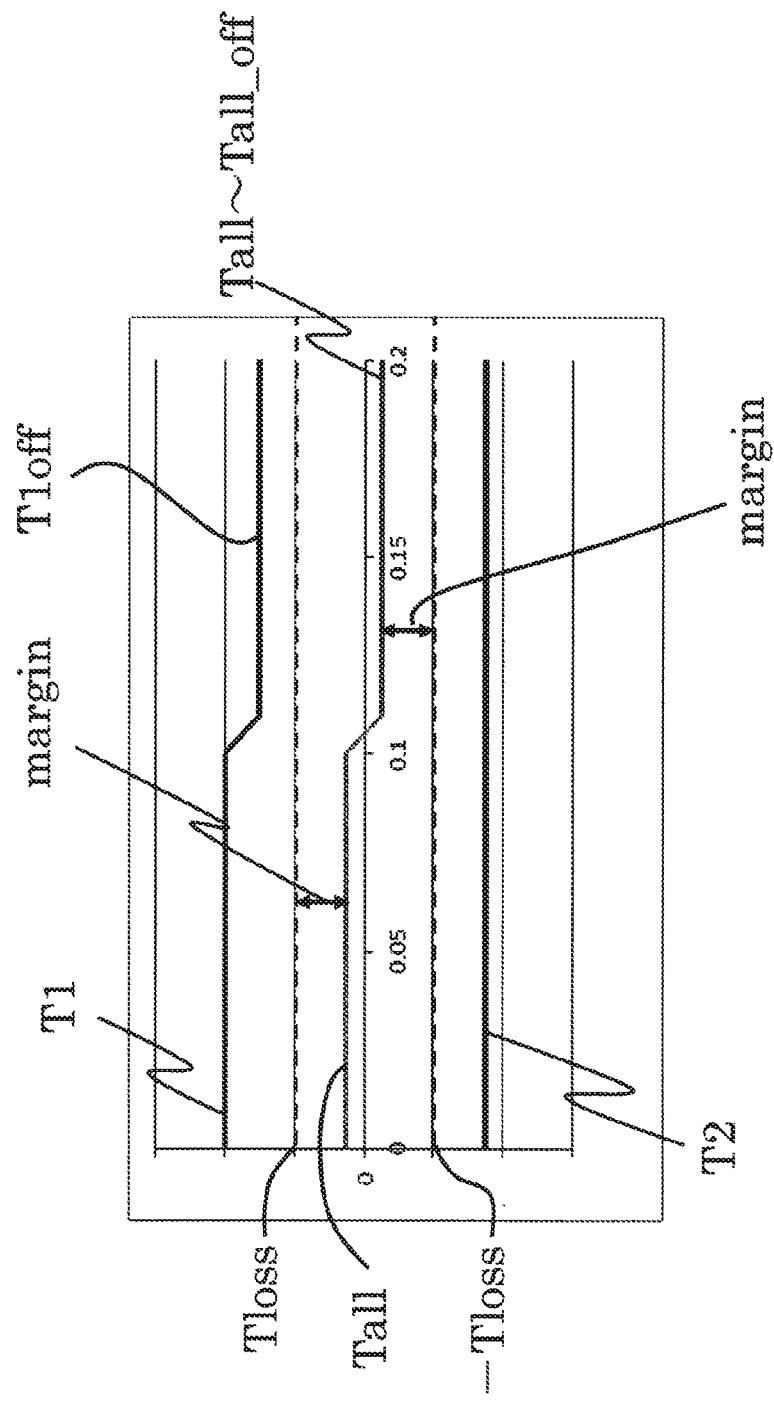
FIG. 8 is a chart representing the relationship between mechanical losses and the output torques at a time when the driving state is switched into the cutoff state at the electric angle of 210 [deg], in a rotating-electric-machine control apparatus according to Embodiment 3 of the present invention.

FIG. 8 is a chart representing the relationship between mechanical losses and the output torques at a time when the driving state is switched into the cutoff state at the electric angle of 210 [deg], in the rotating-electric-machine control apparatus according to Embodiment 3 of the present invention; the ordinate denotes the torque, and the abscissa denotes the time point. In the case of the foregoing electric angle of 210 [deg], as represented in FIG. 8, both the first armature winding 31 and the second armature winding 32 are in the driving state in the period from the time point "0" to the time point "0.1"; the output torque T1 produced by the first armature winding 31 and the output torque T2 produced by the second armature winding 32 are set in such a way as to satisfy the equation (21).

Therefore, as represented by the equation (22), the respective absolute values of the output torque Tall of the rotating electric machine 3 and the output torque Tall_off of the rotating electric machine 3, each of which is the sum of the output torque T1off produced by the first armature winding 31 and the output torque T2 produced by the second armature winding 32, become equal to each other, i.e., Tall is equal to Tall_off.

Next, at the time point "0.1", the U-phase upper arm switching device 20aU for the first armature winding 31 is brought into the cutoff state; in the period after and including the time point "0.1", the cutoff state is continued. In the cutoff state, the output torque Tall_off of the rotating electric machine 3, which is the sum of the output torque T1off produced by the first armature winding 31 and the output torque T2 produced by the second armature winding 32, becomes a value given by the equation (22), and the absolute value thereof is equal to the Tall.

The mechanical loss Tloss always exists in each of the "+" side and the "−" side, and each of the absolute values of the output torque T1 and the output torque T1off is larger than the mechanical loss Tloss; however, each of the output torque Tall in the driving state and the output torque Tall_off in the cutoff state is smaller than the absolute value of the mechanical loss Tloss and hence the rotor of the rotating electric machine 3 does not rotate. As described above, the margin for the mechanical loss Tloss in the driving state and the margin for the mechanical loss Tloss in the cutoff state can be set to be equal to each other; thus, in comparison with foregoing FIGS. 5 and 7, the margin in which each of the absolute values of the output torque Tall and the output torque Tall_off reaches the mechanical loss Tloss can be enlarged.

As described above, because the absolute value of the output torque in the driving state and the absolute value of the output torque in the cutoff state are equal to each other, it is made possible to obtain an effect that when the equation (23) below is satisfied, the behavior change of the rotating electric machine 3 can be suppressed both in the driving state and in the cutoff state, which is unprecedented in conventional apparatuses.

$$\left|\frac{T_1 - T_{1off}}{2}\right| < T_{loss} \quad (23)$$

In the equation (21), the output torque T2 to be produced by the second armature winding 32 is determined in such a way that Tall becomes equal to −Tall_off; however, the behavior change of the rotating electric machine 3 can be decreased also by setting the output torque T2 to be a value between −T1 and −T1off. In this case, the output torque T2 to be produced by the second armature winding 32 should satisfy the equation (24) below, by use of a constant k that is between 0 and 1.

$$T_2 = -kT_1 - (1-k)T_{1off} \quad (24)$$

For example, when the output torque T1 at a time when the first armature winding 31 is in the driving state is 0 [Nm], the respective output torques in the driving state and in the cutoff state can be expressed as in the equation (25) below; the output torque of the rotating electric machine 3 can be decreased both in the driving state and in the cutoff state.

$$\begin{cases} T_{all} = -(1-k)T_{1off} \\ T_{all\_off} = kT_{1off} \end{cases} \quad (25)$$

Moreover, for example, when the output torque T1off at a time when the first armature winding 31 is in the cutoff state is 0 [Nm], the respective output torques in the driving state and in the cutoff state can also be expressed as in the equation (26) below; the output torque of the rotating electric machine 3 can be decreased both in the driving state and in the cutoff state.

$$\begin{cases} T_{all} = (1-k)T_1 \\ T_{all\_off} = -kT_1 \end{cases} \quad (26)$$

In other words, when the current command or the voltage command is determined in such a way that the output torque T2 produced by the second armature winding 32 becomes larger than −T1 but smaller than −T1off or larger than −T1off but smaller than −T1, both the sum of the output torques produced in the driving state and the sum of the output torques produced in the cutoff state can be decreased and hence the output torque can be suppressed to be smaller than the mechanical loss even when a larger current is made to flow; thus, there can be obtained an effect that it is made possible to realize a state where even when a current is flowing, the rotor does not rotate, which is unprecedented in conventional apparatuses.

It is made possible to configure an electric power steering apparatus that produces torque for assisting steering torque, by use of the rotating-electric-machine control apparatus according to Embodiment 3 of the present invention, described above. As is well known, output torque produced by an electric power steering apparatus is transferred onto the handwheel axle of a vehicle through a gear or a chain and may operate as a torque ripple or self-rotating torque that discomforts a user. In contrast, in the electric power steering apparatus equipped with the rotating-electric-machine control apparatus according to Embodiment 1 of the present invention, the output torque produced at a time when the switching device cutoff switching unit issues an indication for switching the state of the switching device to the cutoff state is made to fall within the mechanical loss, so that it is made possible to obtain an unprecedented effect that user's feeling of discomfort is reduced.

Each of the respective rotating-electric-machine control apparatuses according to foregoing Embodiments 1 through 3 of the present invention and an electric power steering apparatus equipped with the rotating-electric-machine control apparatus is the "reduction to practice" of at least one of the following inventions.

(1) A rotating-electric-machine control apparatus for controlling a rotating electric machine having at least a first armature winding and a second armature winding, the rotating-electric-machine control apparatus comprising:

a voltage applying device that converts a DC voltage from a DC power source into an AC voltage and applies the AC voltage to the first armature winding and the second armature winding;

a voltage command calculator that is configured in such a way as to calculate a voltage command, based on a current command for the rotating electric machine;

a switching signal generator that is configured in such a way as to output a switching signal for driving a switching device included in the voltage applying device, based on the voltage command calculated by the voltage command calculator;

a switching device cutoff switcher that is configured in such a way as to switch the state of the switching device from a driving state to a cutoff state; and a switching device cutoff failure determiner that is configured in such a way as to determine a failure in the switching device cutoff switcher, wherein when the switching device cutoff failure determiner determines a failure in the switching device cutoff switcher, the current command or the voltage command is set in such a way that when the switching device is in the driving state, the respective directions of output torque produced based on the first armature winding and output torque produced based on the second armature winding are opposite to each other or in such a way that when the switching device is in the cutoff state, the respective directions of output torque produced based on the first armature winding and output torque produced based on the second armature winding are opposite to each other.

In the rotating-electric-machine control apparatus according to the present invention, the output torque is suppressed before a failure in the switching device cutoff switcher is determined; thus, the state where behavior is not likely to occur can be realized.

(2) The rotating-electric-machine control apparatus according to (1), wherein when the switching device is in the driving state, letting T1 and T2 denote output torque based on the first armature winding and output torque produced based on the second armature winding, respectively, the T1 and the T2 are produced in such a way as to substantially satisfy [T1+T2=0].

In the rotating-electric-machine control apparatus according to the present invention, the output torque is canceled before a failure in the switching device cutoff switching unit is determined; thus, the state where behavior does not occur can be realized.

(3) The rotating-electric-machine control apparatus according to (1), wherein when the switching device is in the cutoff state, letting T1off and T2 denote output torque based on the first armature winding and output torque produced based on the second armature winding, respectively, the T1off and the T2 are produced in such a way as to substantially satisfy [T1off+T2=0].

In the rotating-electric-machine control apparatus according to the present invention, the output torque is canceled before a failure in the switching device cutoff switching unit is determined; thus, the state where behavior does not occur can be realized.

(4) A rotating-electric-machine control apparatus for controlling a rotating electric machine having at least a first armature winding and a second armature winding, the rotating-electric-machine control apparatus comprising:
a voltage applying device that converts a DC voltage from a DC power source into an AC voltage and applies the AC voltage to the first armature winding and the second armature winding;
a voltage command calculator that is configured in such a way as to calculate a voltage command, based on a current command for the rotating electric machine;
a switching signal generator that is configured in such a way as to output a switching signal for driving a switching device included in the voltage applying device, based on the voltage command calculated by the voltage command calculator;
a switching device cutoff switcher that is configured in such a way as to switch the state of the switching device from a driving state to a cutoff state; and
a switching device cutoff failure determiner that is configured in such a way as to determine a failure in the switching device cutoff switcher,
wherein when the switching device cutoff failure determiner determines a failure in the switching device cutoff switcher, the current command or the voltage command is set in such a way that letting T1 denote output torque based on the first armature winding at a time when the switching device is in the driving state, letting T1off denote output torque based on the first armature winding at a time when the switching device is in the cutoff state, and letting T2 denote output torque produced based on the second armature winding, the T2 is larger than −T1 but smaller than −T1off or larger than −T1off but smaller than −T1.

In the rotating-electric-machine control apparatus according to the present invention, both the sum of the output torques produced in the driving state and the sum of the output torques produced in the cutoff state decrease and hence the output torque can be suppressed to fall within the mechanical loss even when a larger current is made to flow; thus, the failure determination can be performed in the state where behavior is not likely to occur.

(5) The rotating-electric-machine control apparatus according to (4), wherein the T1, the T1off, and the T2 substantially satisfy [T2=−(T1+T1off)/2].

In the rotating-electric-machine control apparatus according to the present invention, the respective signs of the sum of the output torques produced in the driving state and the sum of the output torques produced in the cutoff state are made to be opposite to each other and hence the output torque can be suppressed to fall within the mechanical loss even when a larger current is made to flow; thus, the failure determination can be performed in the state where behavior does not occur.

(6) The rotating-electric-machine control apparatus according to (5), wherein letting Tloss denote a mechanical loss exerted on a rotation axle of the rotating electric machine, the T1 and the T1off substantially satisfy [|T1−T1off|/2<Tloss].

In the rotating-electric-machine control apparatus according to the present invention, the sum of the output torques is suppressed to fall within the mechanical loss; thus, the state where behavior does not occur can be maintained.

(7) The rotating-electric-machine control apparatus according to any one of (1) through (6), wherein letting T1 denote output torque based on the first armature winding at a time when the switching device is in the driving state, letting T1off denote output torque based on the first armature winding at a time when the switching device is in the cutoff state, letting T2 denote output torque produced based on the second armature winding, and letting Tloss denote a mechanical loss exerted on the rotation axle of the rotating electric machine, the T1, the T1off, and the T2 substantially satisfy [|T1+T2|<Tloss] or [|T1off+T2|<Tloss].

In the rotating-electric-machine control apparatus according to the present invention, the sum of the output torques is suppressed to fall within the mechanical loss; thus, the state where behavior does not occur can be maintained.

(8) The rotating-electric-machine control apparatus according to (1), further including a voltage detector that detects respective terminal voltages applied to the first armature winding and the second armature winding, wherein the switching device cutoff failure determiner determines a failure in the switching device cutoff switcher, based on the detected terminal voltage.

In the rotating-electric-machine control apparatus according to the present invention, because a failure is determined by use of a voltage detector, which is utilized in normal control, it is not required to provide any additional circuit; thus, the cost can be reduced.

(9) The rotating-electric-machine control apparatus according to (1), further including a current detector that detects a current flowing in the switching device, wherein the switching device cutoff failure determiner determines a failure in the switching device cutoff switcher, based on the value of the detected current.

In the rotating-electric-machine control apparatus according to the present invention, because a failure is determined by use of a shunt resistor, which is utilized in normal control, it is not required to provide any additional circuit; thus, the cost can be reduced.

(10) The rotating-electric-machine control apparatus according to (1), further including a current detector that detects respective currents flowing in the first armature winding and the second armature winding, wherein the switching device cutoff failure determiner determines a failure in the switching device cutoff switcher, based on the value of the detected current.

In the rotating-electric-machine control apparatus according to the present invention, because a failure is determined by use of a current detector, which is utilized in normal control, it is not required to provide any additional circuit; thus, the cost can be reduced.

(11) The rotating-electric-machine control apparatus according to (9), wherein when the switching device cutoff switcher switches the state of the switching device from the driving state to the cutoff state, the voltage command calculator calculates a voltage command, without utilizing the value of the current detected by the current detector.

In the rotating-electric-machine control apparatus according to the present invention, feedback of the detection current is stopped in the cutoff state, so that it is made possible that a current change due to the cutoff does not affect the voltage command.

(12) The rotating-electric-machine control apparatus according to (1), wherein when the switching device cutoff switcher switches the state of the switching device from the driving state to the cutoff state, the voltage command calculator utilizes a voltage command in the driving state before the switching, as the voltage command in the cutoff state.

In the rotating-electric-machine control apparatus according to the present invention, the last value in the driving state is held, so that a simple unit makes it possible that a current change due to the cutoff does not affect the voltage command.

(13) An electric power steering apparatus comprising:
a rotating-electric-machine control apparatus for controlling a rotating electric machine having at least a first armature winding and a second armature winding; and
a rotating electric machine that is controlled by the rotating-electric-machine control apparatus and generates assist torque for assisting steering by a vehicle driver,
wherein the rotating-electric-machine control apparatus includes
a voltage applying device that converts a DC voltage from a DC power source into an AC voltage and applies the AC voltage to the first armature winding and the second armature winding;
a voltage command calculator that is configured in such a way as to calculate a voltage command, based on a current command for the rotating electric machine;
a switching signal generator that is configured in such a way as to output a switching signal for driving a switching device included in the voltage applying device, based on the voltage command calculated by the voltage command calculator;
a switching device cutoff switcher that is configured in such a way as to switch the state of the switching device from a driving state to a cutoff state; and
a switching device cutoff failure determiner that is configured in such a way as to determine a failure in the switching device cutoff switcher,
wherein when the switching device cutoff failure determiner determines a failure in the switching device cutoff switcher, the current command or the voltage command is set in such a way that when the switching device is in the driving state, the respective directions of output torque produced based on the first armature winding and output torque produced based on the second armature winding are opposite to each other or in such a way that when the switching device is in the cutoff state, the respective directions of output torque produced based on the first armature winding and output torque produced based on the second armature winding are opposite to each other.

In the electric power steering apparatus according to the present invention, there is demonstrated an effect that the output torque can be suppressed before a failure in the switching device cutoff switcher is determined and that the configuration required for ascertaining the switching-device cutoff function can be simplified.

(14) An electric power steering apparatus comprising:
a rotating-electric-machine control apparatus for controlling a rotating electric machine having at least a first armature winding and a second armature winding; and
a rotating electric machine that is controlled by the rotating-electric-machine control apparatus and generates assist torque for assisting steering by a vehicle driver,
wherein the rotating-electric-machine control apparatus controls a rotating electric machine having at least a first armature winding and a second armature winding and includes
a voltage applying device that converts a DC voltage from a DC power source into an AC voltage and applies the AC voltage to the first armature winding and the second armature winding;
a voltage command calculator that is configured in such a way as to calculate a voltage command, based on a current command for the rotating electric machine;
a switching signal generator that is configured in such a way as to output a switching signal for driving a switching device included in the voltage applying device, based on the voltage command calculated by the voltage command calculator;
a switching device cutoff switcher that is configured in such a way as to switch the state of the switching device from a driving state to a cutoff state; and
a switching device cutoff failure determiner that is configured in such a way as to determine a failure in the switching device cutoff switcher,
wherein when the switching device cutoff failure determiner determines a failure in the switching device cutoff switcher, the current command or the voltage command is set in such a way that letting T1 denote output torque based on the first armature winding at a time when the switching device is in the driving state, letting T1off denote output torque based on the first armature winding at a time when the switching device is in the cutoff state, and letting T2 denote output torque produced based on the second armature winding, the T2 is larger than [−T1] but smaller than [−T1off] or larger than [−T1off] but smaller than [−T1].

In the electric power steering apparatus according to the present invention, both the sum of the output torques produced in the driving state and the sum of the output torques produced in the cutoff state decrease and hence the output torque can be suppressed to fall within the mechanical loss even when a larger current is made to flow; thus, the failure determination can be performed in the state where behavior is not likely to occur.

The present invention is not limited to the respective rotating-electric-machine control apparatuses according to foregoing Embodiments 1 through 3 and to an electric power steering apparatus equipped with the rotating-electric-machine control apparatus; in the scope within the spirits of the present invention, the respective configurations of Embodiments 1 and 3 can appropriately be combined with each other, can partially be modified, or can partially be omitted.

INDUSTRIAL APPLICABILITY

A rotating-electric-machine control apparatus according to the present invention can be applied not only to a control apparatus for a rotating electric machine such as a permanent-magnet synchronous AC rotating electric machine but also to the field utilizing the rotating electric machine. Furthermore, an electric power steering apparatus equipped with the rotating-electric-machine control apparatus according to the present invention can be applied to the field of a vehicle such as an automobile that utilizes the electric power steering apparatus.

DESCRIPTION OF REFERENCE NUMERALS

1: control unit
2: DC power source
3: rotating electric machine
6: voltage command calculation unit
7a: 1st voltage applying unit
7b: 2nd voltage applying unit
8: switching device cutoff switching unit
9: switching device cutoff failure determination unit
10: angle information detection unit
11: angle calculation unit
12: rotation speed calculation unit
15a: 1st switching signal generation unit
15b: 2nd switching signal generation unit
31: 1st armature winding
32: 2nd armature winding

The invention claimed is:

1. A rotating-electric-machine control apparatus for controlling a rotating electric machine having at least a first armature winding and a second armature winding, the rotating-electric-machine control apparatus comprising:
a voltage applying device that converts a DC voltage from a DC power source into an AC voltage and applies the AC voltage to the first armature winding and the second armature winding;
a voltage command calculator that is configured in such a way as to calculate a voltage command, based on a current command for the rotating electric machine;
a switching signal generator that is configured in such a way as to output a switching signal for driving a switching device included in the voltage applying device, based on the voltage command calculated by the voltage command calculator;
a switching device cutoff switcher that is configured in such a way as to switch the state of the switching device from a driving state to a cutoff state; and
a switching device cutoff failure determiner that is configured in such a way as to determine a failure in the switching device cutoff switcher,
wherein when the switching device cutoff failure determiner determines a failure in the switching device cutoff switcher, the current command or the voltage command is set in such a way that when the switching device is in the driving state, the respective directions of output torque produced based on the first armature winding and output torque produced based on the second armature winding are opposite to each other or in such a way that when the switching device is in the cutoff state, the respective directions of output torque produced based on the first armature winding and output torque produced based on the second armature winding are opposite to each other.

2. The rotating-electric-machine control apparatus according to claim 1, wherein when the switching device is in the driving state, letting T1 and T2 denote output torque based on the first armature winding and output torque produced based on the second armature winding, respectively, the T1 and the T2 are produced in such a way as to substantially satisfy [T1+T2=0].

3. An electric power steering apparatus comprising:
the rotating-electric-machine control apparatus according to claim 2; and
a rotating electric machine that is controlled by the rotating-electric-machine control apparatus and generates assist torque for assisting steering by a vehicle driver.

4. The rotating-electric-machine control apparatus according to claim 1, wherein when the switching device is in the cutoff state, letting T1off and T2 denote output torque based on the first armature winding and output torque produced based on the second armature winding, respectively, the T1off and the T2 are produced in such a way as to substantially satisfy [T1off+T2=0].

5. An electric power steering apparatus comprising:
the rotating-electric-machine control apparatus according to claim 4; and
a rotating electric machine that is controlled by the rotating-electric-machine control apparatus and generates assist torque for assisting steering by a vehicle driver.

6. The rotating-electric-machine control apparatus according to claim 1, wherein letting T1 denote output torque based on the first armature winding at a time when the switching device is in the driving state, letting T1off denote output torque based on the first armature winding at a time when the switching device is in the cutoff state, letting T2 denote output torque produced based on the second armature winding, and letting Tloss denote a mechanical loss exerted on the rotation axle of the rotating electric machine, the T1, the T1off, and the T2 are produced in such a way as to substantially satisfy [|T1+T2|<Tloss] or [|T1off+T2|<Tloss].

7. An electric power steering apparatus comprising:
the rotating-electric-machine control apparatus according to claim 6; and
a rotating electric machine that is controlled by the rotating-electric-machine control apparatus and generates assist torque for assisting steering by a vehicle driver.

8. The rotating-electric-machine control apparatus according to claim 1, further including a voltage detector that detects respective terminal voltages applied to the first armature winding and the second armature winding, wherein the switching device cutoff failure determiner determines a failure in the switching device cutoff switcher, based on the detected terminal voltage.

9. An electric power steering apparatus comprising:
the rotating-electric-machine control apparatus according to claim 8; and
a rotating electric machine that is controlled by the rotating-electric-machine control apparatus and generates assist torque for assisting steering by a vehicle driver.

10. The rotating-electric-machine control apparatus according to claim 1, further including a current detector that detects a current flowing in the switching device, wherein the switching device cutoff failure determiner determines a failure in the switching device cutoff switcher, based on the value of the detected current.

11. The rotating-electric-machine control apparatus according to claim wherein when the switching device cutoff switcher switches the state of the switching device from the driving state to the cutoff state, the voltage command calculator calculates a voltage command, without utilizing the value of the current detected by the current detector.

12. An electric power steering apparatus comprising:
the rotating-electric-machine control apparatus according to claim 10; and
a rotating electric machine that is controlled by the rotating-electric-machine control apparatus and generates assist torque for assisting steering by a vehicle driver.

13. The rotating-electric-machine control apparatus according to claim 1, further including a current detector that detects respective currents flowing in the first armature winding and the second armature winding, wherein the switching device cutoff failure determiner determines a failure in the switching device cutoff switcher, based on the value of the detected current.

14. An electric power steering apparatus comprising:
the rotating-electric-machine control apparatus according to claim 13; and
a rotating electric machine that is controlled by the rotating-electric-machine control apparatus and generates assist torque for assisting steering by a vehicle driver.

15. The rotating-electric-machine control apparatus according to claim 1, wherein when the switching device cutoff switcher switches the state of the switching device from the driving state to the cutoff state, the voltage command calculator utilizes a voltage command in the driving state before the switching, as the voltage command in the cutoff state.

16. An electric power steering apparatus comprising:
the rotating-electric-machine control apparatus according to claim 1; and
a rotating electric machine that is controlled by the rotating-electric-machine control apparatus and generates assist torque for assisting steering by a vehicle driver.

17. A rotating-electric-machine control apparatus for controlling a rotating electric machine having at least a first armature winding and a second armature winding, the rotating-electric-machine control apparatus comprising:
a voltage applying device that converts a DC voltage from a DC power source into an AC voltage and applies the AC voltage to the first armature winding and the second armature winding;
a voltage command calculator that is configured in such a way as to calculate a voltage command, based on a current command for the rotating electric machine;
a switching signal generator that is configured in such a way as to output a switching signal for driving a switching device included in the voltage applying device, based on the voltage command calculated by the voltage command calculator;
a switching device cutoff switcher that is configured in such a way as to switch the state of the switching device from a driving state to a cutoff state; and
a switching device cutoff failure determiner that is configured in such a way as to determine a failure in the switching device cutoff switcher,
wherein when the switching device cutoff failure determiner determines a failure in the switching device cutoff switcher, the current command or the voltage command is set in such a way that letting T1 denote output torque based on the first armature winding at a time when the switching device is in the driving state, letting T1off denote output torque based on the first armature winding at a time when the switching device is in the cutoff state, and letting T2 denote output torque produced based on the second armature winding, the T2 is larger than [−T1] but smaller than [−T1off] or larger than [−T1off] but smaller than [−T1].

18. The rotating-electric-machine control apparatus according to claim 17, wherein the T1, the T1off, and the T2 are produced in such a way as to substantially satisfy [T2=−(T1+T1off)/2].

19. The rotating-electric-machine control apparatus according to claim 18, wherein letting Tloss denote a mechanical loss exerted on a rotation axle of the rotating electric machine, the T1 and the T1off are produced in such a way as to substantially satisfy [|T1−T1off|/2<Tloss].

20. An electric power steering apparatus comprising:
the rotating-electric-machine control apparatus according to claim 17; and
a rotating electric machine that is controlled by the rotating-electric-machine control apparatus and generates assist torque for assisting steering by a vehicle driver.

* * * * *